(12) United States Patent
Jeon et al.

(10) Patent No.: US 11,812,633 B2
(45) Date of Patent: Nov. 7, 2023

(54) DISPLAY DEVICE INCLUDING AN INORGANIC PATTERN POSITIONED IN A PERIPHERAL AREA OF THE SUBSTRATE

(71) Applicant: SAMSUNG DISPLAY CO., LTD., Yongin-si (KR)

(72) Inventors: Woo Sik Jeon, Hwaseong-si (KR); Sang Yeol Kim, Hwaseong-si (KR); Tae Hyun Sung, Uiwang-si (KR); Seung Soo Hong, Bucheon-si (KR); Eon Seok Oh, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 24 days.

(21) Appl. No.: 17/336,096

(22) Filed: Jun. 1, 2021

(65) Prior Publication Data

US 2022/0149321 A1    May 12, 2022

(30) Foreign Application Priority Data

Nov. 9, 2020 (KR) .................. 10-2020-0148598

(51) Int. Cl.
*H10K 50/844* (2023.01)
*H10K 59/12* (2023.01)
*H10K 71/00* (2023.01)

(52) U.S. Cl.
CPC .......... *H10K 50/844* (2023.02); *H10K 59/12* (2023.02); *H10K 71/00* (2023.02); *H10K 59/1201* (2023.02)

(58) Field of Classification Search
CPC . H01L 51/5253; H01L 27/3244; H01L 51/56; H01L 2227/323; H01L 27/3258; H01L 51/5012; H01L 27/3246; H01L 27/3225; H01L 51/5056; H01L 51/5072; H01L 51/5088; Y02P 70/50; H10K 50/844; H10K 59/12; H10K 71/00; H10K 59/1201; H10K 50/11; H10K 59/124;
(Continued)

(56) References Cited

U.S. PATENT DOCUMENTS 10,629,658 B1 *  4/2020  Zhang ................ H01L 27/3276
10,644,087 B2     5/2020  Lee et al.
(Continued)

FOREIGN PATENT DOCUMENTS

KR   10-2016-0001500   1/2016
KR   10-2016-0057197   5/2016
(Continued)

*Primary Examiner* — Caleb E Henry
(74) *Attorney, Agent, or Firm* — H.C. Park & Associates, PLC

(57) ABSTRACT

A display device and a manufacturing method thereof, and a display device including: a substrate including a display area, an opening area positioned in the display area, and a peripheral area positioned between the opening area and the display area; a transistor positioned in the display area of the substrate; a first electrode connected to the transistor; a second electrode positioned on the first electrode; an inorganic pattern portion positioned in the peripheral area of the substrate; and an intermediate layer positioned between the first electrode and the second electrode, and including at least one organic layer positioned on the inorganic pattern portion. The inorganic pattern portion includes a plurality of inorganic patterns spaced apart from each other.

14 Claims, 24 Drawing Sheets

(58) Field of Classification Search
CPC ...... H10K 59/122; H10K 50/15; H10K 50/16; H10K 50/17; H10K 59/00
See application file for complete search history.

(56) References Cited

U.S. PATENT DOCUMENTS

| | | | |
|---|---|---|---|
| 10,720,486 B2* | 7/2020 | Lhee | H10K 50/844 |
| 10,770,525 B2* | 9/2020 | Jiang | H01L 51/5212 |
| 10,840,317 B2 | 11/2020 | Oh et al. | |
| 11,335,761 B2* | 5/2022 | Lhee | H10K 59/88 |
| 11,476,297 B2* | 10/2022 | Lee | H01L 27/3276 |
| 2016/0307971 A1* | 10/2016 | Jeon | H01L 27/3225 |
| 2017/0331058 A1* | 11/2017 | Seo | G09F 9/30 |
| 2018/0102502 A1* | 4/2018 | Kim | H01L 27/3258 |
| 2018/0151834 A1* | 5/2018 | Kanaya | H01L 51/504 |
| 2018/0159077 A1* | 6/2018 | Lee | H10K 59/12 |
| 2018/0287093 A1* | 10/2018 | Lee | H01L 51/5225 |
| 2019/0131572 A1* | 5/2019 | Gwon | H01L 51/5246 |
| 2019/0229175 A1* | 7/2019 | Lhee | H10K 50/844 |
| 2019/0363275 A1* | 11/2019 | Ochi | H01L 51/5246 |
| 2020/0075692 A1* | 3/2020 | Park | H01L 27/3244 |
| 2020/0093016 A1* | 3/2020 | Yee | G06F 1/1656 |
| 2020/0136068 A1 | 4/2020 | Lee et al. | |
| 2020/0144535 A1* | 5/2020 | Kim | H01L 51/5253 |
| 2020/0176520 A1* | 6/2020 | Kim | H01L 51/5253 |
| 2020/0212147 A1* | 7/2020 | Han | H01L 25/18 |
| 2020/0212159 A1* | 7/2020 | Lee | H01L 51/5237 |
| 2020/0321561 A1* | 10/2020 | Park | H01L 51/5253 |
| 2020/0350393 A1* | 11/2020 | Lhee | H10K 50/844 |
| 2022/0254862 A1* | 8/2022 | Lhee | H10K 71/191 |

FOREIGN PATENT DOCUMENTS

| | | |
|---|---|---|
| KR | 10-2019-0096467 | 8/2019 |
| KR | 10-2020-0044442 | 4/2020 |
| KR | 10-2020-0049115 | 5/2020 |
| KR | 10-2020-0082496 | 7/2020 |
| KR | 10-2020-0102580 | 9/2020 |

* cited by examiner

12

DISPLAY DEVICE INCLUDING AN INORGANIC PATTERN POSITIONED IN A PERIPHERAL AREA OF THE SUBSTRATE

CROSS-REFERENCE TO RELATED APPLICATION

This application claims priority from and the benefit of Korean Patent Application No. 10-2020-0148598, filed on Nov. 9, 2020, which is hereby incorporated by reference for all purposes as if fully set forth herein.

BACKGROUND

Field

Embodiments of the invention relate generally to a display device and a manufacturing method thereof.

Discussion of the Background

A display device is a device for displaying images on a screen, and includes a liquid crystal display (LCD) and an organic light emitting diode (OLED). A display device is used in various electronic devices, such as portable phones, GPS, digital cameras, electronic books, portable game devices, or various terminals. Recently, usages of the electronic devices have been integrated, for example, a camera may be installed in a cell phone.

In this instance, an opening may be formed in a predetermined region of the display device of the cell phone so as to install the camera in the cell phone. At this time, a layer exposed by formation of the opening may be contaminated from the outside. Further, as the layer is further contaminated, elements positioned around the opening may not be normally operated.

The above information disclosed in this Background section is only for enhancement of understanding of the background of the described technology, and therefore it may contain information that does not form the prior art that is already known in this country to a person of ordinary skill in the art.

The above information disclosed in this Background section is only for understanding of the background of the inventive concepts, and, therefore, it may contain information that does not constitute prior art.

SUMMARY

Embodiments of the present invention provide a display device for improving reliability of a device in a peripheral area surrounding an opening, and a manufacturing method thereof.

Additional features of the inventive concepts will be set forth in the description which follows, and in part will be apparent from the description, or may be learned by practice of the inventive concepts.

An embodiment provides a display device including: a substrate including a display area, an opening area positioned in the display area, and a peripheral area positioned between the opening area and the display area; a transistor positioned in the display area of the substrate; a first electrode connected to the transistor; a second electrode positioned on the first electrode; an inorganic pattern portion positioned in the peripheral area of the substrate; and an intermediate layer positioned between the first electrode and the second electrode, and including at least one organic layer positioned on the inorganic pattern portion. The inorganic pattern portion includes a plurality of inorganic patterns spaced apart from each other.

The intermediate layer may be positioned on an upper surface of the inorganic pattern portion, and not on a lateral surface of the inorganic pattern portion.

The intermediate layer may not be positioned among adjacent inorganic patterns.

The intermediate layer positioned in the display area may be separated from the intermediate layer positioned on the inorganic pattern portion.

The second electrode may not overlap the inorganic pattern portion.

The display device may further include an inorganic insulating layer positioned among a plurality of layers configuring the transistor. The inorganic pattern portion may include a same material as the inorganic insulating layer.

The inorganic insulating layer may include a first inorganic insulating layer and a second inorganic insulating layer, and the inorganic pattern may include a first inorganic pattern layer including a same material as the first inorganic insulating layer, and a second inorganic pattern layer including a same material as the second inorganic insulating layer.

The inorganic insulating layer may include at least three inorganic insulating layers, and the inorganic pattern may include at least three inorganic pattern layers including the same material as the inorganic insulating layer.

An end of the inorganic insulating layer may be positioned on a boundary portion between the display area and the peripheral area, and the intermediate layer may be separated at the end of the inorganic insulating layer.

The intermediate layer may be positioned on an upper surface of the end of the inorganic insulating layer, and not on a lateral surface of the inorganic insulating layer.

An angle between a lateral surface of the inorganic pattern and an upper surface of the substrate may be equal to or greater than 75 degrees and equal to or less than 120 degrees.

The lateral surface of the inorganic pattern may be perpendicular to the upper surface of the substrate.

The inorganic pattern may have a reverse taper shape.

The opening area may overlap an electronic module.

The intermediate layer may include an organic function layer, and the organic function layer may include at least one of a hole injection layer, a hole transporting layer, an electron transporting layer, and an electron injection layer.

Another embodiment provides a method for manufacturing a display device, including: forming an inorganic insulating layer and a transistor in a display area of a substrate; forming an inorganic pattern portion and a sacrificial layer in an opening area positioned in a display area of the substrate and in a peripheral area positioned between the opening area and the display area; forming a first electrode connected to the transistor; forming an intermediate material layer entirely on the substrate; forming a second electrode material layer on the intermediate material layer; and separating the sacrificial layer, a portion of the intermediate material layer and a portion of the second electrode material layer positioned on the sacrificial layer from the substrate by irradiating laser beams to the inorganic pattern portion.

The inorganic pattern portion may include a plurality of inorganic patterns spaced apart from each other, and the sacrificial layer may be formed on a lateral surface of the inorganic pattern portion.

The inorganic pattern portion may include the same material as at least part of the inorganic insulating layer, the sacrificial layer may include the same material as at least some of a plurality of layers configuring the transistor, and an angle between a lateral surface of the inorganic pattern and an upper surface of the substrate may be equal to or greater than 75 degrees and equal to or less than 120 degrees.

The intermediate material layer positioned on the lateral surface of the inorganic pattern may be removed and the intermediate material layer positioned on the upper surface of the inorganic pattern may remain by the irradiation of laser beams.

The second electrode material layer positioned on the inorganic pattern and among the inorganic patterns may be removed by the irradiation of laser beams.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
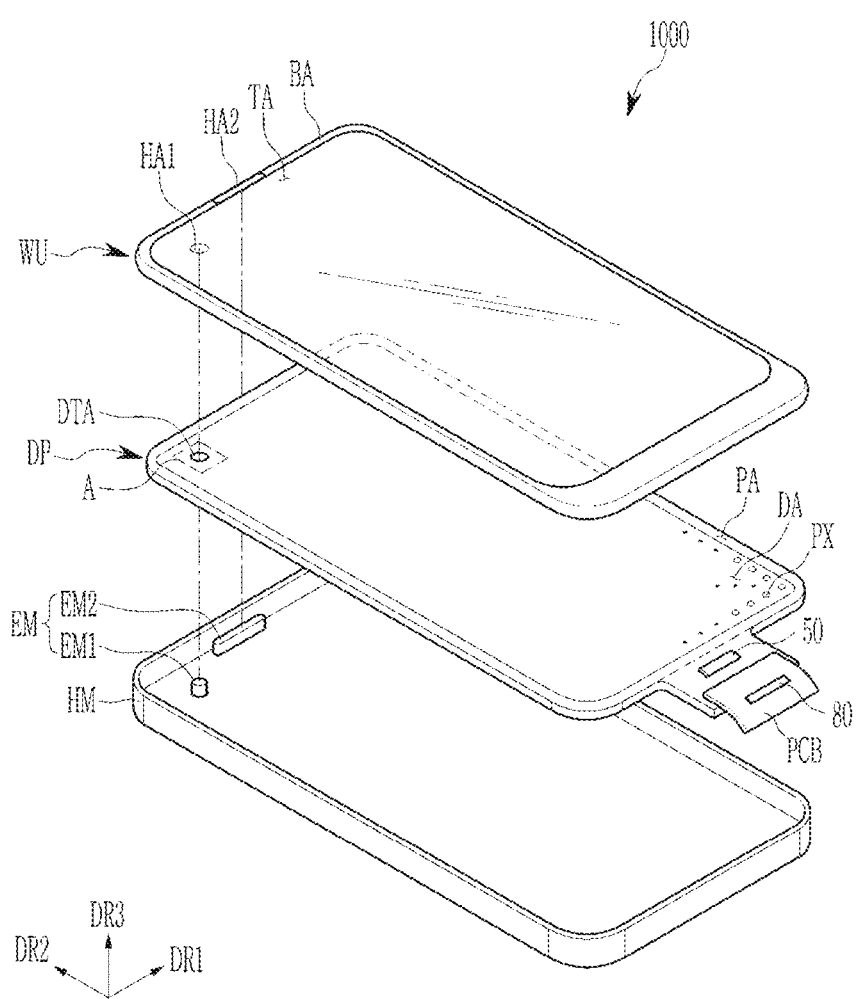
FIG. 1 illustrates an exploded perspective view of a display device according to an embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display device according to an embodiment will now be described with reference to FIG. 1 to FIG. 3. FIG. 1 shows an exploded perspective view of a display device according to an embodiment, FIG. 2 shows a cross-sectional view of a display device according to an embodiment, and FIG. 3 shows a top plan view of constituent elements of a display panel according to an embodiment.

Figure 2:
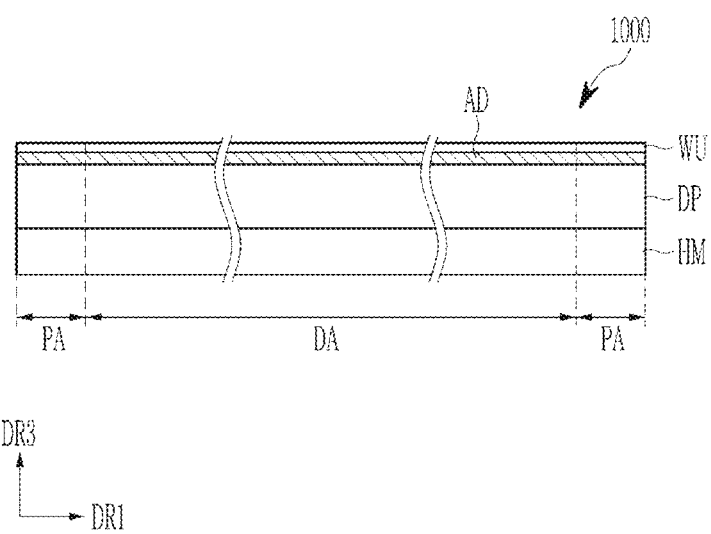
FIG. 2 illustrates a cross-sectional view of a display device according to an embodiment.
Figure 3:
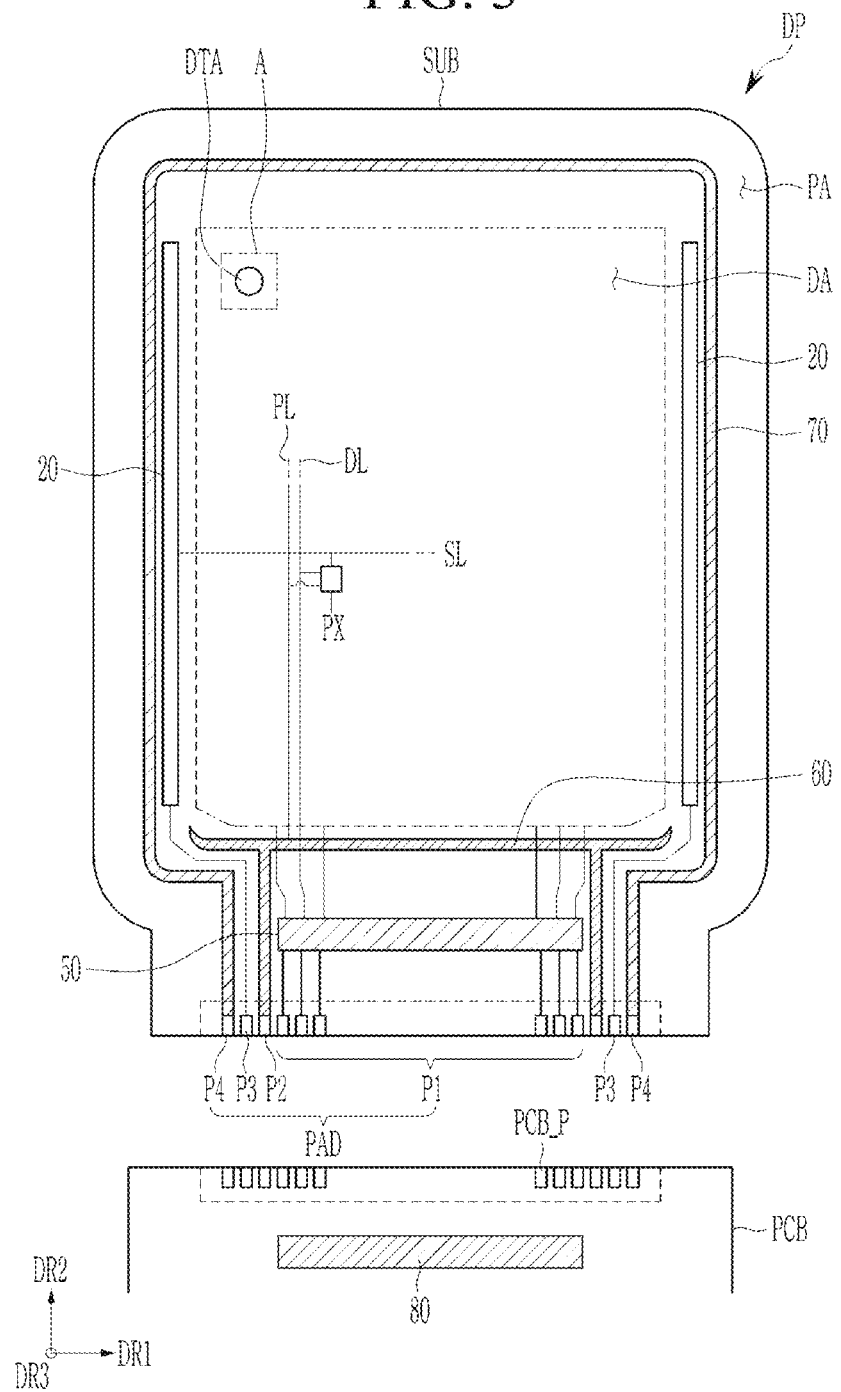
FIG. 3 illustrates a top plan view of constituent elements of a display panel according to an embodiment.

Referring to FIG. 1 and FIG. 2, the display device 1000 displays images in a third direction DR3 on a plane defined by a first direction DR1 and a second direction DR2. A front surface (or a top surface) and a rear surface (or a bottom surface) of respective members are distinguished by the third direction DR3. Directions indicated by the first to third directions DR1, DR2, and DR3 are relative concepts and may be changed into other directions.

The display device 1000 includes a cover window (WU), a display panel (DP), and a housing member (HM). In the present embodiment, the display device 1000 may be configured by combining the cover window (WU), the display panel (DP), and the housing member (HM).

The cover window (WU) is disposed on the display panel (DP) to protect the display panel (DP). The cover window (WU) may include a transmission area (TA) and a blocking area (BA). The transmission area (TA) is an optically transparent region, and it may be a region for transmitting light. The blocking area (BA) may have relatively low light transmittance, compared to the transmission area (TA). The blocking area (BA) defines a shape of the transmission area (TA). The blocking area (BA) may surround the transmission area (TA). The blocking area (BA) may express a predetermined color. The blocking area (BA) may overlap the non-display area (PA) of the display panel (DP) to prevent the non-display area (PA) from being visible from the outside.

The cover window (WU) may include a first hole area HA1 and a second hole area HA2. The first hole area HA1 and the second hole area HA2 may respectively overlap an electronic module (EM), to be described later. The electronic module (EM) may receive external signals provided through the first hole area HA1 and the second hole area HA2, and may then be operated.

According to an embodiment, the first hole area HA1 may be positioned in the transmission area (TA), and the second hole area HA2 may be positioned in the blocking area (BA). This is, however, only an example, and the first hole area HA1 and the second hole area HA2 may be positioned in regions that are opposite to each other, they may be positioned in the transmission area (TA), or they may be positioned in the blocking area (BA). Further, a number of the hole areas is not limited to 2, and three or more hole areas may be formed.

A predetermined denting portion that dents in a rear surface of the cover window (WU) may be defined to the first hole area HA1 and the second hole area HA2. The denting portion may include a groove having a depth that is less than the thickness of the cover window (WU) or an opening.

The first hole area HA1 and the second hole area HA2 may have different shapes. The first hole area HA1 may have a circular shape in a plan view, and the second hole area HA2 may have an oval shape with a long axis extending in the first direction DR1 in a plan view. The shapes of the first hole area HA1 and the second hole area HA2 are, however, not limited thereto, and the sizes or the shapes may be modifiable in many ways.

The display panel (DP) may be a flat rigid display panel, and without being limited thereto, it may be a flexible display panel. The display panel according to an embodiment may be an emissive display panel, but is not specifically limited thereto. For example, the display panel may be an organic light emitting panel or a quantum dot light emitting display panel. An emission layer of the organic light emitting panel may be an organic light emitting material. The emission layer of the quantum dot light emitting display panel may include a quantum dot and a quantum rod. Hereinafter, the display panel will be described as an organic light emitting panel.

The display panel (DP) displays an image on the front surface. The front surface of the display panel (DP) includes a display area (DA) and a non-display area (PA). The image is displayed in the display area (DA). The non-display area (PA) may surround the display area (DA).

The display panel (DP) may include a plurality of pixels PXs positioned in the display area (DA). The pixels (PX) may display light in response to an electrical signal. Light displayed by the pixels (PX) may realize images. A number of transistors and capacitors included by one pixel (PX) and a connection relationship thereof are changeable in many ways.

The display panel (DP) may include an opening area (DTA) penetrating through the display panel (DP). The opening area (DTA) may be positioned in the display area (DA). The region A in which the opening area (DTA) is positioned will be described in a later portion of the present specification. The opening area (DTA) may overlap the first hole area HA1 of the cover window (WU). Some of a plurality of pixels (PX) may be disposed to surround the opening area (DTA). Therefore, the image may also be displayed to the region positioned near the opening area (DTA).

The display panel (DP) includes a non-display area (PA) which extends from the display area (DA) and in which a plurality of signal lines and a pad unit are positioned. A data driver 50 may be positioned in the non-display area (PA). According to an embodiment, the pad unit of the non-display area (PA) may be electrically connected to the printed circuit board (PCB) including a driving chip 80, which will be described with reference to FIG. 3.

As shown in FIG. 2, an adhesive layer (AD) for combining the display panel (DP) and the cover window (WU) may be positioned between the display panel (DP) and the cover window (WU). Although not shown in the present specification, a touch unit positioned between the display panel (DP) and the cover window (WU) may be further included. The touch unit may be disposed on the display panel (DP) for a touchscreen function of the display device 1000. The touch unit may include a touch electrode with various patterns, and it may be a resistive type or a capacitive type.

The electronic module (EM) includes various functional modules for operating the display device 1000. The electronic module (EM) may be electrically connected to the display panel (DP) through a connector (not shown). For example, the electronic module (EM) may be a camera, a speaker, or a light or heat sensor.

The electronic module (EM) may include a first electronic module EM1 and a second electronic module EM2. The first electronic module EM1 may sense an external object received through the opening area (DTA) and the first hole area HA1. The first electronic module EM1 may receive an external input transmitted through the opening area (DTA) and the first hole area HA1, or may provide an output through the opening area (DTA) and the first hole area HA1.

For example, the first electronic module EM1 may be at least one of a light emitting module, a light sensing module, and a photographing module. For example, the first electronic module EM1 may include at least one of a light emitting module for outputting infrared rays, a CMOS sensor for sensing infrared rays, and a camera module for photographing external objects.

The second electronic module EM2 may collect a sound signal, such as voice, through the second hole area HA2, or may provide the processed sound signal, such as voice, to the outside. For example, the second electronic module EM2 may include at least one of a sound input module and a sound output module. The sound input module may include a microphone for receiving a sound signal. The sound output module may include a speaker for outputting sound data as sound signals.

This is, however, an example, and the electronic module (EM) may be configured with a single module, may further include a greater number of electronic modules, or may be arranged according to various disposal relationships, and it is not limited to one of embodiments.

The housing member (HM) is disposed on a lower surface of the display panel (DP). The housing member (HM) is combined to the cover window (WU) to configure an exterior of the display device 1000. The housing member (HM) may include a material with relatively high rigidity. For example, the housing member (HM) may include a plurality of frames and/or plates made of glass, plastic, or metal.

The housing member (HM) provides a predetermined receiving space. The display panel (DP) may be received in the receiving space and may be protected from external impacts.

Referring to FIG. 3, the display panel (DP) includes a substrate (SUB) including a display area (DA) and a non-display area (PA). The non-display area (PA) may be defined along the edge of the display area (DA).

The display panel (DP) includes a plurality of pixels (PX). A plurality of pixels (PX) may be disposed in the display area (DA) of the substrate (SUB). The respective pixels (PX) include a light-emitting device and a driving circuit unit connected to the same. The respective pixels (PX) may, for example, emit red, green, blue, or white light, and may, for example, include an organic light emitting diode.

The display panel (DP) may include a plurality of signal lines and pad units. A plurality of signal lines may include a scan line (SL) extending in the first direction DR1, a data line (DL) extending in the second direction DR2, and a driving voltage line (PL).

The scan driver 20 generates a scan signal and transmits it to the respective pixels (PX) through the scan line (SL). According to an embodiment, the scan driver 20 may be disposed on a left side and a right side of the display area (DA). The present specification describes a configuration in which the scan driver 20 is disposed on respective sides of the substrate (SUB), but the scan driver may be disposed on one side of the substrate (SUB) according to another embodiment.

The pad unit (PAD) is disposed at one end of the display panel (DP), and includes a plurality of terminals (P1, P2, P3, and P4). The pad unit (PAD) may not be covered by an insulating layer but may be exposed to thereby be electrically connected to the printed circuit board (PCB). The pad unit (PAD) may be electrically connected to the pad unit (PCB_P) of the printed circuit board (PCB). The printed circuit board (PCB) may transmit a signal of an IC driving chip 80 or a power voltage to the pad unit (PAD).

The controller converts a plurality of image signals transmitted from the outside into a plurality of image data signals, and transmits the converted signals to the data driver 50 through the terminal P1. Further, the controller may receive a vertical synchronization signal, a horizontal synchronizing signal, and a clock signal, may generate a control signal for controlling the scan driver 20 and the data driver 50, and may transmit the control signal to elements through the terminals P3 and P1. The controller transmits a driving voltage (ELVDD) to the driving voltage supply wire 60 through the terminal P2. The controller also transmits a common voltage (ELVSS) to the respective common voltage supply wires 70 through the terminal P4.

The data driver 50 is disposed in the non-display area (PA), and it generates a data signal and transmits the same to the respective pixels (PX). The data driver 50 may be disposed on one side of the display panel (DP), and for example, it may be disposed between the pad unit (PAD) and the display area (DA).

The driving voltage supply wire 60 is disposed in the non-display area (PA). For example, the driving voltage supply wire 60 may be disposed between the data driver 50 and the display area (DA). The driving voltage supply wire 60 provides the driving voltage (ELVDD) to the pixels (PX). The driving voltage supply wire 60 is disposed in the first direction DR1, and it may be connected to a plurality of driving voltage lines (PL) disposed in the second direction DR2.

The common voltage supply wire 70 is disposed in the non-display area (PA). The common voltage supply wire 70 may surround the substrate (SUB). The common voltage supply wire 70 transmits the common voltage (ELVSS) to one electrode (e.g., a second electrode) of the light-emitting device included by the pixel (PX).

Figure 4:
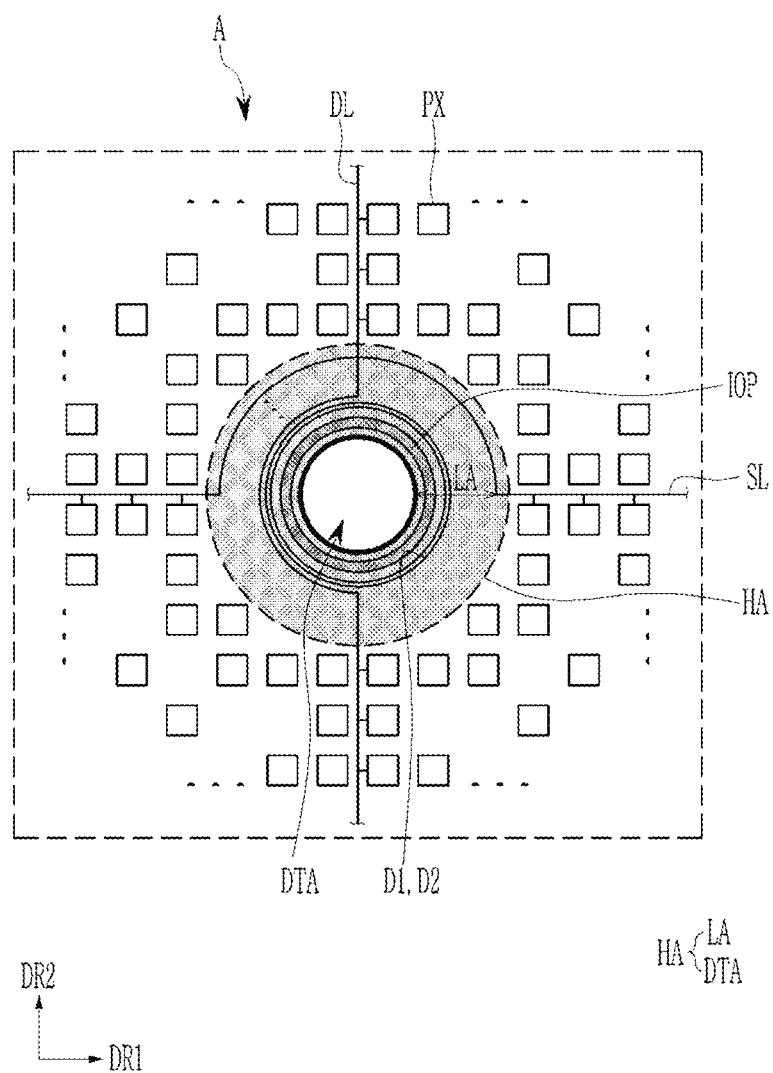
FIG. 4 illustrates a top plan view of an enlarged region A of FIG. 1 and FIG. 3.

The region A including the opening area (DTA) shown in FIG. 3 will now be described with reference to FIG. 4. FIG. 4 shows a top plan view of enlarging a region A of FIG. 1 and FIG. 3.

Referring to FIG. 4 together with the above-described drawings, the display panel (DP) includes a plurality of signal lines (SL and DL) positioned on the substrate, and a plurality of pixels (PX). A plurality of pixels (PX) may be respectively connected to a plurality of signal lines (SL and DL). FIG. 4 illustrates a scan line (SL) and a data line (DL) from among a plurality of signal lines. This is, however, an example, and the respective pixels PX according to an embodiment may be additionally connected to various signal lines and are not limited to one embodiment.

The hole area (HA) included by the display panel (DP) includes an opening area (DTA) and a peripheral area (LA) surrounding the opening area (DTA).

The peripheral area (LA) surrounds an external portion of the opening area (DTA). The peripheral area (LA) may be positioned between the opening area (DTA) and the display area (DA). The peripheral area (LA) may prevent wires from being damaged when laser beams are irradiated to form an opening area (DTA). It is needed to maintain a minimum width of the peripheral area (LA).

An inorganic pattern portion (IOP) and dams D1 and D2 may be positioned in the peripheral area (LA). In this instance, the inorganic pattern portion (IOP) may be positioned between the opening area (DTA) and the dams D1 and D2. That is, the inorganic pattern portion (IOP) may be positioned nearer the opening area (DTA) than the dams D1 and D2 are.

The scan line (SL) and the data line (DL) may have a semicircular structure, may overlap the peripheral area (LA), and may detour around the opening area (DTA). A plurality of scan lines (SL) extend in a horizontal direction along a peripheral side of the opening area (DTA). Here, a plurality of scan lines (SL) may be configured with a scan line, an emission control line, and an initialization voltage line according to a signal. A plurality of data lines (DL) extend in a vertical direction along a peripheral side of the opening area (DTA). A plurality of data lines (DL) may be configured with a driving voltage line and a low driving voltage line according to a signal. According to an embodiment, a plurality of scan lines (SL) and a plurality of data lines (DL) may be changed.

A portion surrounding the opening area (DTA) will now be described with reference to FIG. 5A, FIG. 5B, FIG. 6A, FIG. 6B, and FIG. 6C.

Figure 5A:
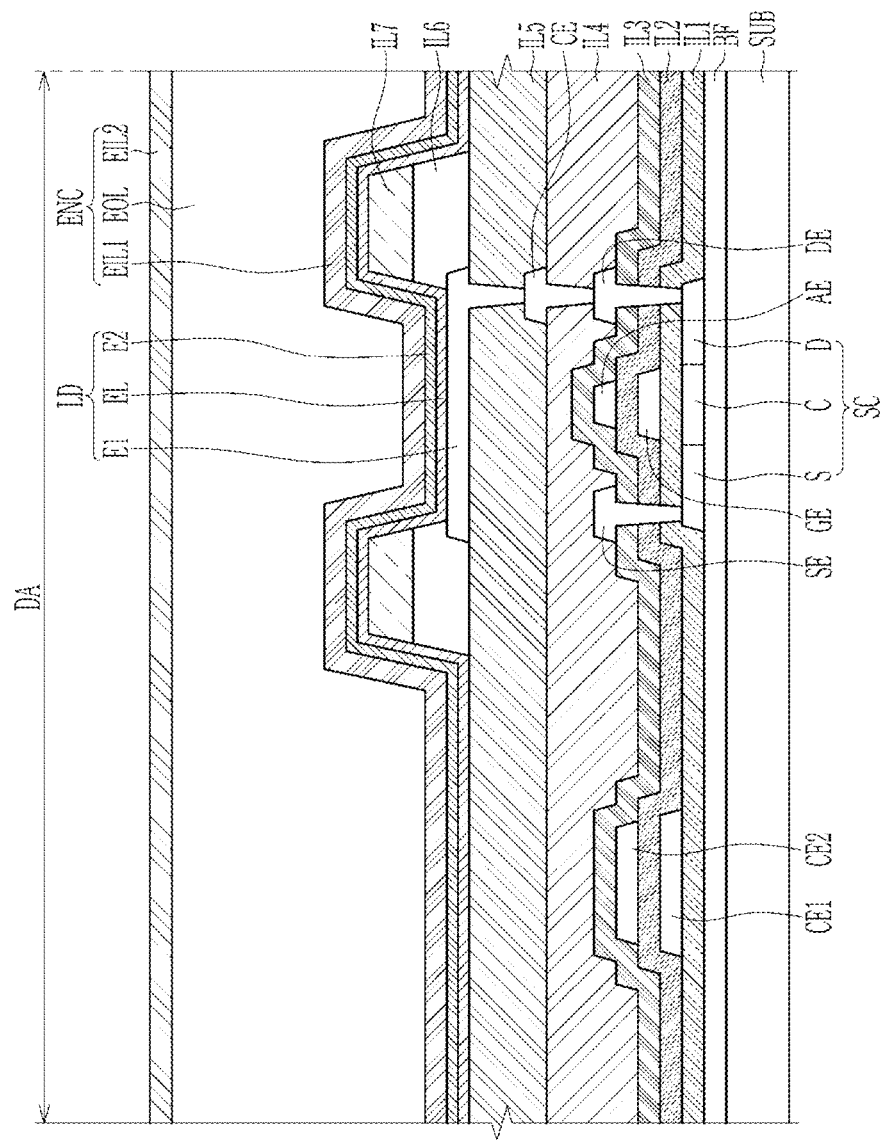
FIG. 5A illustrates a cross-sectional view of a display panel corresponding to a display area.
Figure 5B:
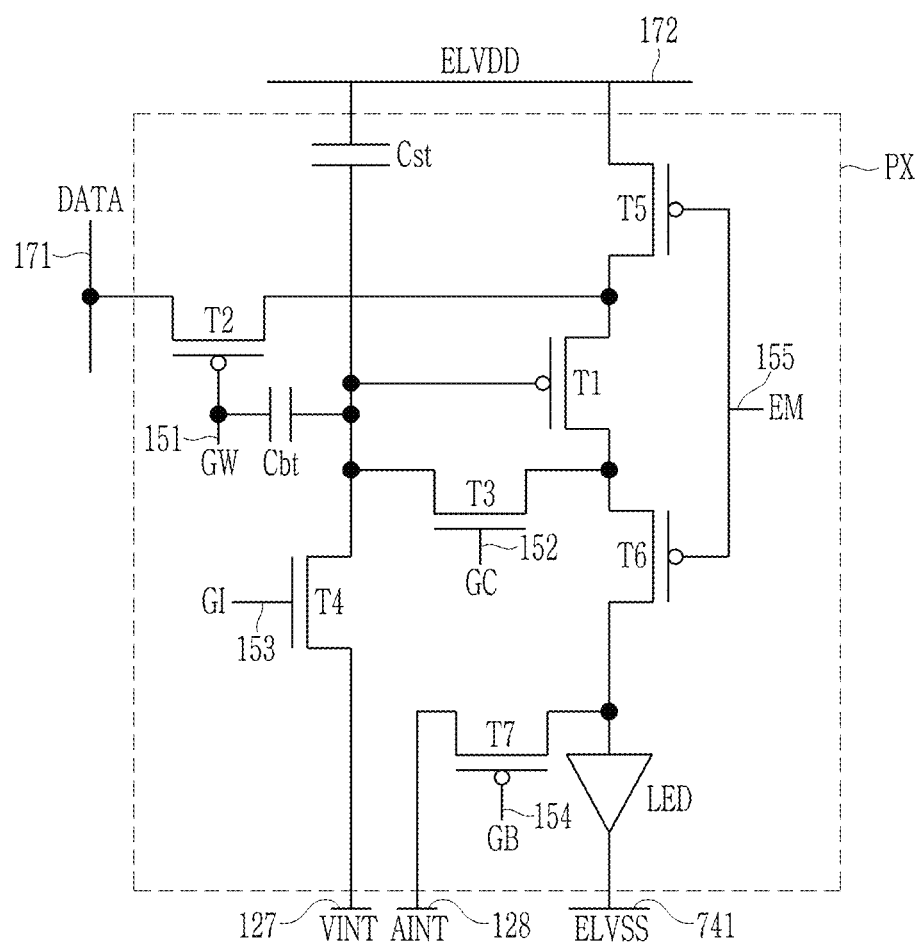
FIG. 5B illustrates a circuit diagram of a display device according to an embodiment.
Figure 6A:
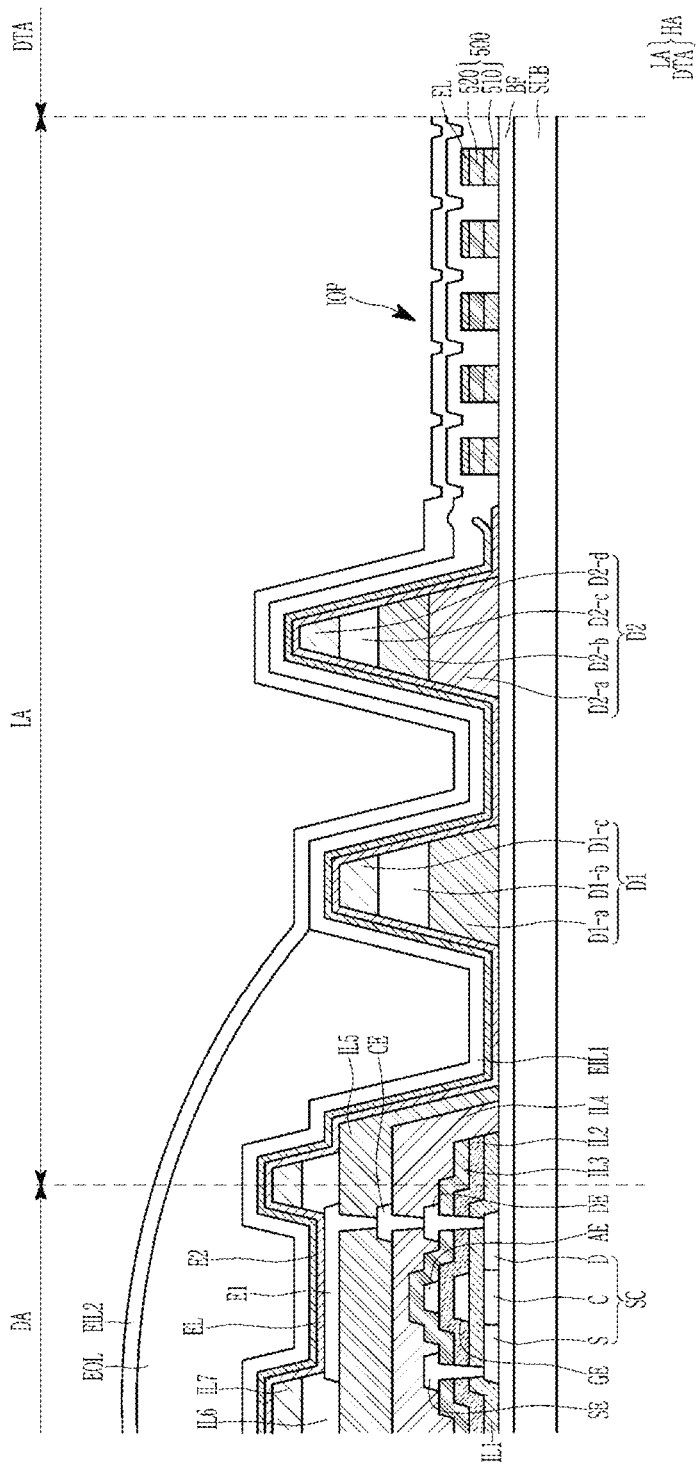
FIG. 6A illustrates a cross-sectional view of a display panel on which a peripheral area and an opening area are positioned.
Figure 6B:
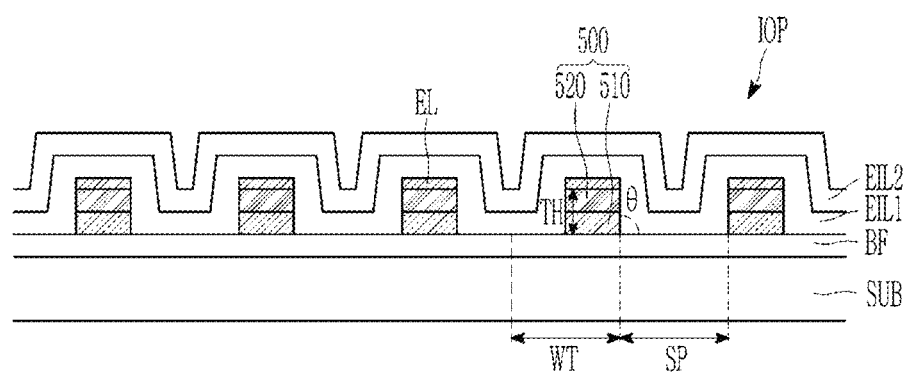
FIG. 6B illustrates a cross-sectional view of an enlarged part of a peripheral area.
Figure 6C:
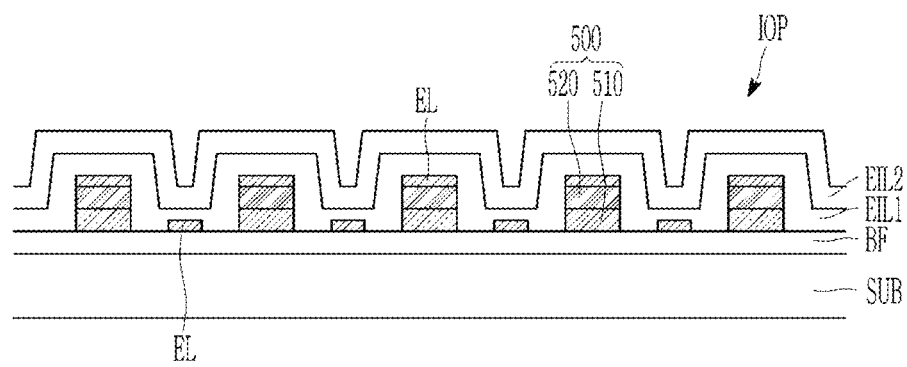
FIG. 6C illustrates an enlarged cross-sectional view of a variation of a display device according to an embodiment.

FIG. 5A shows a cross-sectional view of a display panel corresponding to a display area, and FIG. 5B shows a circuit diagram of a display device according to an embodiment. FIG. 6A shows a cross-sectional view of a display panel on which a peripheral area and an opening area are positioned, FIG. 6B shows a cross-sectional view of an enlarged part of a peripheral area, and FIG. 6C shows an enlarged cross-sectional view of a variation of a display device according to an embodiment.

A stacking structure of a display area (DA) will now be described with reference to FIG. 5A.

The substrate (SUB) according to an embodiment may include an inorganic insulating material, such as glass, or an organic insulating material, such as plastic, such as a polyimide (PI). The substrate (SUB) may be single or multi-layered. The substrate (SUB) may have a structure in which at least one base layer including sequentially stacked polymer resin and at least one inorganic layer are alternately stacked.

The substrate (SUB) may have various degrees of flexibility. The substrate (SUB) may be a rigid substrate or a flexible substrate that may be bent, folded, or rolled.

A buffer layer (BF) may be positioned on the substrate (SUB). The buffer layer (BF) may stop degradation of a characteristic of the semiconductor layer (SC), and may ease a stress by preventing impurities from being transmitted to an upper layer of the buffer layer (BF), particularly the semiconductor layer (SC), from the substrate (SUB). The buffer layer (BF) may include an inorganic insulating material or an organic insulating material, such as a silicon nitride or a silicon oxide. All or part of the buffer layer (BF) may be omitted.

A semiconductor layer (SC) is positioned on the buffer layer (BF). The semiconductor layer (SC) may include at least one of polysilicon and an oxide semiconductor. The semiconductor layer (SC) includes a channel region (C), a first region (S), and a second region (D). The first region (S) and the second region (D) are disposed on respective sides of the channel region (C). The channel region (C) may include a semiconductor to which a small amount of impurity is doped compared to the first region (S) and the second region (D) or to which no impurity is doped, and the first region (S) and the second region (D) may include a semiconductor to which a large amount of impurity is doped compared to the channel region (C). The semiconductor layer (SC) may be made of an oxide semiconductor, and in this case, a protective layer (not shown) may be added to protect the oxide semiconductor material that is weak against external conditions such as a high temperature.

A first inorganic insulating layer IL1 is positioned on the semiconductor layer (SC). The first inorganic insulating layer IL1 may be a single layer or a multilayer including at least one of a silicon oxide ($SiO_x$), a silicon nitride ($SiN_x$), and a silicon oxynitride ($SiO_xN_y$).

A gate electrode (GE) and a first capacitor electrode (CE1) are positioned on the first inorganic insulating layer IL1. The gate electrode (GE) and the first capacitor electrode (CE1) may be a single layer or a multilayer on which a metal layer including one of copper (Cu), a copper alloy, aluminum (Al), an aluminum alloy, molybdenum (Mo), and a molybdenum alloy is stacked. The gate electrode (GE) may overlap the channel region (C) of the semiconductor layer (SC).

A second inorganic insulating layer IL2 is positioned on the gate electrode (GE) and the first inorganic insulating layer ILL The second inorganic insulating layer IL2 may be a single layer or a multilayer including at least one of a silicon oxide ($SiO_x$), a silicon nitride ($SiN_x$), and a silicon oxynitride ($SiO_xN_y$).

An upper electrode (AE) and a second capacitor electrode (CE2) are positioned on the second inorganic insulating layer IL2. The second capacitor electrode (CE2) and the upper electrode (AE) may be different portions of one conductive pattern. The second capacitor electrode (CE2) may be electrically connected to the upper electrode (AE).

The second capacitor electrode (CE2) and the upper electrode (AE) may be a single layer or a multilayer on which a metal layer including one of copper (Cu), a copper alloy, aluminum (Al), an aluminum alloy, molybdenum (Mo), and a molybdenum alloy is stacked.

A third inorganic insulating layer IL3 is positioned on the upper electrode (AE) and the second capacitor electrode (CE2). The third inorganic insulating layer IL3 may be a single layer or a multilayer including at least one of a silicon oxide ($SiO_x$), a silicon nitride ($SiN_x$), and a silicon oxynitride ($SiO_xN_y$).

A source electrode (SE) and a drain electrode (DE) are positioned on the third inorganic insulating layer IL3. The source electrode (SE) and the drain electrode (DE) are respectively connected to the first region (S) and the second region (D) of the semiconductor layer (SC) through contact holes formed in the first, second, and third inorganic insulating layers IL1, IL2, and IL3.

The source electrode (SE) and the drain electrode (DE) may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and they may be a single-layered or multi-layered structure including the same.

A first organic insulating layer IL4 and a second organic insulating layer IL5 are sequentially positioned on the third inorganic insulating layer IL3, the source electrode (SE), and the drain electrode (DE). The first organic insulating layer IL4 and the second organic insulating layer IL5 may include an organic insulating material including a general purpose polymer such as poly(methyl methacrylate) or polystyrene, a polymer derivative having a phenol-based group, an acryl-based polymer, an imide-based polymer, a polyimide, an acryl-based polymer, and a siloxane-based polymer.

A connecting member (CE) may be positioned between the first organic insulating layer IL4 and the second organic insulating layer IL5. The connecting member (CE) may connect the drain electrode (DE) and the first electrode (E1).

However, without being limited thereto, the drain electrode (DE) may be directly connected to the first electrode (E1) without a connecting member depending on embodiments.

A first electrode (E1) is positioned on the second organic insulating layer IL5. The first electrode (E1) is connected to the connecting member (CE) through a contact hole of the second organic insulating layer IL5. The first electrode (E1) is electrically connected to the drain electrode (DE).

The first electrode (E1) may include a metal, such as silver (Ag), lithium (Li), calcium (Ca), aluminum (Al), magnesium (Mg), or gold (Au), and may include a transparent conductive oxide (TCO) such as an indium tin oxide (ITO) or an indium zinc oxide (IZO). The first electrode (E1) may be made of a single layer including a metal material or a transparent conductive oxide, or a multilayer including the same. For example, the first electrode (E1) may have a triple-layered structure of indium tin oxide (ITO)/silver (Ag)/indium tin oxide (ITO).

The transistor formed of a gate electrode (GE), a semiconductor layer (SC), a source electrode (SE), and a drain electrode (DE) is connected to the first electrode (E1) and supplies a current to the light-emitting device (LD).

A partition wall IL6 and a spacer IL7 are positioned on the second organic insulating layer IL5 and the first electrode (E1).

The partition wall IL6 includes an opening overlapping at least part of the first electrode (E1) and defining a light emitting region. The opening may have a substantially similar planar shape to the first electrode (E1). The opening may have a rhombus shape in a plan view or an octagonal shape that is similar to the rhombus, but without being limited thereto, it may have various shapes, such as a quadrangle, a polygon, a circle, or an oval.

The partition wall IL6 and the spacer IL7 may include an organic insulating material including a general purpose polymer such as poly(methyl methacrylate) or polystyrene, a polymer derivative having a phenol-based group, an acryl-based polymer, an imide-based polymer, a polyimide, an acryl-based polymer, and a siloxane-based polymer.

An intermediate layer (EL) is positioned on the first electrode (E1) overlapping the opening. The intermediate layer (EL) may include at least one organic layer, and may be made into a multilayer. The intermediate layer (EL) may include an emission layer and an organic function layer. The emission layer may include an organic material and/or an inorganic material. Further, the organic function layer may include a hole injection layer (HIL), a hole transporting layer (HTL), an electron transporting layer (ETL), and an electron injection layer (EIL). The intermediate layer (EL) may generate a predetermined colored light. The intermediate layer (EL) is illustrated to be positioned in the display area (DA) and the peripheral area (LA), and at least part of the intermediate layer (EL) may be positioned in the display area (DA) and may not be positioned in the peripheral area (LA). For example, the emission layer may be positioned in the opening of the partition wall IL6 by using a mask. In this instance, the emission layer is positioned in the display area (DA), and is not positioned in the peripheral area (LA). The organic function layer may be positioned in the display area (DA) and the peripheral area (LA).

A second electrode (E2) is positioned on the intermediate layer (EL). The second electrode (E2) may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), and calcium (Ca), or a transparent conductive oxide (TCO), such as an indium tin oxide (ITO) or an indium zinc oxide (IZO).

The first electrode (E1), the intermediate layer (EL), and the second electrode (E2) may configure a light-emitting device (LD). Here, the first electrode (E1) may be an anode that is a hole injecting electrode, and the second electrode (E2) may be a cathode that is an electron injecting electrode. However, is the inventive concepts are not limited thereto, and the first electrode (E1) may be a cathode and the second electrode (E2) may be an anode according to a method for driving an emissive display device.

Holes and electrons are injected into the organic intermediate layer (EL) from the first electrode (E1) and the second electrode (E2), and light emits when excitons that are a combination of the injected holes and electrons fall to a ground state from an excited state.

An encapsulation layer (ENC) is positioned on the second electrode (E2). The encapsulation layer (ENC) may cover an upper surface of the light-emitting device (LD) and a lateral surface thereof to seal the same. The light-emitting device is very weak against moisture and oxygen, so the encapsulation layer (ENC) seals the light-emitting device (LD) to block an inflow of external moisture and oxygen.

The encapsulation layer (ENC) may include a plurality of layers, and may be made of complex layers including an inorganic layer and an organic layer, and for example, the encapsulation layer (ENC) may be formed to be triple layers configured by sequentially stacking a first encapsulating inorganic layer (EIL1), an encapsulating organic layer (EOL), and a second encapsulating inorganic layer (EIL2).

The first encapsulating inorganic layer (EIL1) may cover the second electrode (E2). The first encapsulating inorganic layer (EIL1) may prevent the external moisture or oxygen from permeating into the light-emitting device (LD). For example, the first encapsulating inorganic layer (EIL1) may include a silicon nitride, a silicon oxide, or a combined compound thereof. The first encapsulating inorganic layer (EIL1) may be made by a deposition process.

The encapsulating organic layer (EOL) may be disposed on the first encapsulating inorganic layer (EIL1) to contact the first encapsulating inorganic layer (EIL1). Curves formed on a top surface of the first encapsulating inorganic layer (EIL1) or particles positioned on the first encapsulating inorganic layer (EIL1) are covered by the encapsulating organic layer (EOL), so a surface state of the top surface of the first encapsulating inorganic layer (EIL1) may block an influence applied to the constituent elements on the encapsulating organic layer (EOL). The encapsulating organic layer (EOL) may also ease stress among the contact layers. The encapsulating organic layer (EOL) may include an organic material, and may be formed by a solution process, such as a spin coating, a slit coating, or an inkjet process.

The second encapsulating inorganic layer (EIL2) is disposed on the encapsulating organic layer (EOL) to cover the encapsulating organic layer (EOL). The second encapsulating inorganic layer (EIL2) may be more stably positioned on a relative planar side than is disposed on the first encapsulating inorganic layer (EIL1). The second encapsulating inorganic layer (EIL2) encapsulates the moisture discharged by the encapsulating organic layer (EOL) to prevent the inflow thereof to the outside. The second encapsulating inorganic layer (EIL2) may include a silicon nitride, a silicon oxide, or a combined compound thereof. The second encapsulating inorganic layer (EIL2) may be formed by a deposition process.

Although not shown, a capping layer positioned between the second electrode (E2) and the encapsulation layer (ENC) may be further included. The capping layer may include an organic material. The capping layer protects the second electrode (E2) from a subsequent process, for example, a sputtering process, and improves light outputting efficiency of the light-emitting device (LD). The capping layer may have a greater refractive index than the first encapsulating inorganic layer (EIL1).

One of the transistors included in one pixel has been described, and each pixel may include a plurality of transistors. A plurality of transistors included in each pixel will now be exemplified with reference to FIG. 5B.

As shown in FIG. 5B, one pixel (PX) of the display device according to an embodiment includes a plurality of transistors T1, T2, T3, T4, T5, T6, and T7 connected to wires 127, 128, 151, 152, 153, 154, 155, 171, 172, and 741, a storage capacitor (Cst), a boost capacitor (Cbt), and a light emitting diode (LED).

One pixel (PX) is connected to a plurality of wires 127, 128, 151, 152, 153, 154, 155, 171, 172, and 741. A plurality of wires include a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 is connected to a gate driver (not shown), and transmits a first scan signal (GW) to the second transistor T2. The second scan signal line 152 may apply a voltage with opposite polarity to a voltage applied to the first scan signal line 151 at the same time as the signal of the first scan signal line 151. For example, when a voltage with negative polarity is applied to the first scan signal line 151, a voltage with positive polarity may be applied to the second scan signal line 152. The second scan signal line 152 transmits a second scan signal (GC) to the third transistor T3.

The initialization control line 153 transmits an initialization control signal (GI) to the fourth transistor T4. The bypass control line 154 transmits a bypass signal (GB) to the seventh transistor T7. The bypass control line 154 may be made of a first scan signal line 151 of a previous stage. The light emission control line 155 transmits a light emission control signal (EM) to the fifth transistor T5 and the sixth transistor T6.

The data line 171 transmits a data voltage (DATA) generated by a data driver (not shown), and luminance of light emitted by the light emitting diode (LED) changes according to the data voltage (DATA) applied to the pixel (PX).

The driving voltage line 172 applies a driving voltage (ELVDD). The first initialization voltage line 127 transmits a first initialization voltage (VINT1), and the second initialization voltage line 128 transmits a second initialization voltage (VINT2). The common voltage line 741 applies a common voltage (ELVSS) to a cathode of the light emitting diode (LED). In the present embodiment, constant voltages may be respectively applied to the driving voltage line 172, the first and second initialization voltage lines 127 and 128, and the common voltage line 741.

A plurality of transistors may include a driving transistor T1, a second transistor T2, a third transistor T3, a fourth transistor T4, a fifth transistor T5, a sixth transistor T6, and a seventh transistor T7. A plurality of transistors may include an oxide transistor including an oxide semiconductor and a silicon transistor including a polycrystalline silicon semiconductor. For example, the third transistor T3 and the fourth transistor T4 may be made of oxide transistors, and the driving transistor T1, the second transistor T2, the fifth transistor T5, the sixth transistor T6, and the seventh transistor T7 may be silicon transistors. They are, however, not limited thereto, and a plurality of transistors may be silicon transistors.

It has been described in the above that one pixel (PX) includes seven transistors (T1 to T7), one storage capacitor (Cst), and one boost capacitor (Cbt), and without being limited thereto, the number of transistors and capacitors, and a relationship thereof, are modifiable in many ways.

A hole area (HA) including an opening area (DTA) and a peripheral area (LA) of the opening area (DTA) will now be described with reference to FIG. 6A and FIG. 6B. The same constituent elements as in the previous descriptions will be omitted.

A buffer layer (BF) may be positioned in the peripheral area (LA) of the substrate (SUB). The buffer layer (BF) may be made into a form extending from the display area (DA). The buffer layer (BF) may be formed entirely in the peripheral area (LA) of the substrate (SUB).

The first inorganic insulating layer ILL the second inorganic insulating layer IL2, the third inorganic insulating layer IL3, the first organic insulating layer IL4, the second organic insulating layer IL5, the partition wall IL6, and the spacer IL7 may be positioned on a boundary between the display area (DA) and the peripheral area (LA). That is, the first inorganic insulating layer ILL the second inorganic insulating layer IL2, the third inorganic insulating layer IL3, the first organic insulating layer IL4, the second organic insulating layer IL5, the partition wall IL6, and the spacer IL7 positioned in the display area (DA) may extend to part of the peripheral area (LA). In this instance, the first organic insulating layer IL4 may be formed to cover lateral surfaces of ends of the first inorganic insulating layer ILL the second inorganic insulating layer IL2, and the third inorganic insulating layer IL3. Further, the second organic insulating layer IL5 may be formed to cover a lateral surface of an end of the first organic insulating layer IL4.

An inorganic pattern portion (IOP) may be positioned on the peripheral area (LA) of the substrate (SUB). A buffer layer (BF) may be positioned between the peripheral area (LA) of the substrate (SUB) and the inorganic pattern portion (IOP). The inorganic pattern portion (IOP) may include an inorganic insulating material. The inorganic pattern portion (IOP) may include a plurality of inorganic patterns 500. A plurality of inorganic patterns 500 are spaced apart from each other with a predetermined interval therebetween. A plurality of inorganic patterns 500 may be spaced apart from each other with a constant interval therebetween. A width (WT) of each inorganic pattern 500 may be equal to or greater than about 2 µm. A space (SP) between the adjacent inorganic patterns 500 may be equal to or greater than about 1.8 µm, about 10 µm. A thickness (TH) of each inorganic pattern 500 may be equal to or greater than about 0.5 µm. Each inorganic pattern 500 may be made into a single layer or a multilayer. For example, the inorganic pattern 500 may include a first inorganic pattern layer 510 and a second inorganic pattern layer 520. The second inorganic pattern layer 520 may be positioned on the first inorganic pattern layer 510. Although FIG. 6A illustrates that the inorganic pattern 500 is made into triple layers, the inventive concepts are not so limited, and the inorganic pattern 500 may also be made into more than triple layers.

The first inorganic pattern layer 510 may be made of the same material as the first inorganic insulating layer IL1. The first inorganic pattern layer 510 may be simultaneously formed in the same process as that of the first inorganic insulating layer IL1. The first inorganic pattern layer 510 is not connected to the first inorganic insulating layer IL1 and is separated from the same. The second inorganic pattern layer 520 may be made of the same material as the second inorganic insulating layer IL2. The second inorganic pattern layer 520 may be simultaneously formed in the same process as that of the second inorganic insulating layer IL2. The second inorganic pattern layer 520 is not connected to the second inorganic insulating layer IL2 and is separated from the same. The materials configuring the first inorganic pattern layer 510 and the second inorganic pattern layer 520 are not limited thereto, and may be changed in various ways. The first inorganic pattern layer 510 may be made of the same material as the second inorganic insulating layer IL2, and the second inorganic pattern layer 520 may be made of the same material as the third inorganic insulating layer IL3. The first inorganic pattern layer 510 may be made of the same material as the first inorganic insulating layer ILL and the second inorganic pattern layer 520 may be made of the same material as the third inorganic insulating layer IL3.

A lateral surface of the inorganic pattern 500 may be formed to be perpendicular to an upper surface of the buffer layer (BF). This is, however, not limited thereto, and an angle (θ) between the lateral surface of the inorganic pattern 500 and the upper surface of the buffer layer (BF) may be about 75 degrees to about 120 degrees. The upper surface of the buffer layer (BF) and the upper surface of the substrate (SUB) may be substantially parallel to each other. Therefore, the lateral surface of the inorganic pattern 500 may be perpendicular to the upper surface of the substrate (SUB). Further, the angle between the lateral surface of the inorganic pattern 500 and the upper surface of the substrate (SUB) may be about 75 degrees to about 120 degrees.

As shown in FIG. 4, the inorganic pattern portion (IOP) may have a ring shape surrounding the opening area (DTA) in a plan view. This is, however, merely an example, and the inorganic pattern portion (IOP) may have a different shape from the opening area (DTA). For example, the inorganic pattern portion (IOP) may have a closed line shape including a polygon, an oval, or at least a partial curved line, or may be provided in a shape including a plurality of patterns that are partly disconnected, and it is not limited to one embodiment.

An intermediate layer (EL) may be positioned on the inorganic pattern portion (IOP). The intermediate layer (EL) positioned on the inorganic pattern portion (IOP) is not connected to the intermediate layer (EL) positioned in the display area (DA) and is separated therefrom. The intermediate layer (EL) may be positioned on an upper surface of the inorganic pattern 500. The intermediate layers (EL) positioned on the respective inorganic patterns 500 are not connected to each other but are separated from each other. The intermediate layer (EL) may not be positioned on lateral surfaces of the respective inorganic patterns 500. The intermediate layer (EL) may not be positioned between the adjacent inorganic patterns 500. However, the intermediate layer (EL) is not limited thereto, and as shown in FIG. 6C, the intermediate layer (EL) may be positioned between the inorganic patterns 500. In this instance, the intermediate layer (EL) positioned on the inorganic pattern 500 is not connected to the intermediate layer (EL) positioned between the inorganic patterns 500, and they are separated from each other.

A second electrode (E2) is not positioned on the inorganic pattern portion (IOP). That is, the second electrode (E2) is not positioned on the intermediate layer (EL) overlapping the inorganic pattern portion (IOP). Therefore, the second electrode (E2) does not overlap the inorganic pattern portion (IOP).

At least two dams D1 and D2 may be positioned in the peripheral area (LA). For example, the first dam D1 and the second dam D2 may be positioned in order for them to be provided near the display area (DA). The first dam D1 and the second dam D2 may be positioned in the peripheral area (LA) and may be positioned on the buffer layer (BF).

The first dam D1 may include a first-1 sub-dam (D1-*a*), a first-2 sub-dam (D1-*b*), and a first-3 sub-dam (D1-*c*). The first-1 sub-dam (D1-*a*) may be positioned on a same layer as the second organic insulating layer IL5 positioned in the display area (DA), and may include a same material. The first-1 sub-dam (D1-*a*) may be formed in the same process as that of the second organic insulating layer IL5 positioned in the display area (DA). The first-2 sub-dam (D1-*b*) may be positioned on the same layer as the partition wall IL6 positioned in the display area (DA), and may include the same material. The first-2 sub-dam (D1-*b*) may be formed in the same process as that of the partition wall IL6 positioned in the display area (DA). The first-3 sub-dam (D1-*c*) may be positioned on the same layer as the spacer IL7 positioned in the display area (DA), and may include the same material. The first-3 sub-dam (D1-*c*) may be formed in the same process as that of the spacer IL7 positioned in the display area (DA).

The second dam D2 may include a second-1 sub-dam (D2-*a*), a second-2 sub-dam (D2-*b*), a second-3 sub-dam (D2-*c*), and a second-4 sub-dam (D2-*d*). The second-1 sub-dam (D2-*a*) may be positioned on the same layer as the first organic insulating layer IL4 positioned in the display area (DA), and may include the same material. The second-1 sub-dam (D2-*a*) may be formed in the same process as that of the first organic insulating layer IL4 positioned in the display area (DA). The second-2 sub-dam (D2-*b*) may be positioned on the same layer as the second organic insulating layer IL5 positioned in the display area (DA), and may include the same material. The second-2 sub-dam (D2-*b*) may be formed in the same process as that of the second organic insulating layer IL5 positioned in the display area (DA). The second-3 sub-dam (D2-*c*) may be positioned on the same layer as the partition wall IL6 positioned in the display area (DA), and may include the same material. The second-3 sub-dam (D2-*c*) may be formed in the same process as that of the partition wall IL6 positioned in the display area (DA). The second-4 sub-dam (D2-*d*) may be positioned on the same layer as the spacer IL7 positioned in the display area (DA), and may include the same material. The second-4 sub-dam (D2-*d*) may be formed in the same process as that of the spacer IL7 positioned in the display area (DA).

The present embodiment illustrates that the first dam D1 has a triple layer structure and the second dam D2 has a quadruple layer structure. They are, however, not limited thereto, and the first dam D1 may have a quadruple layer structure and the second dam D2 may have a triple layer structure (i.e., their positions may be changed), the first dam D1 and the second dam D2 may have a triple layer structure, or the first dam D1 and the second dam D2 may have a quadruple layer structure. A double layer dam including part of the above-noted sub-dam may also be provided. The present specification illustrates an embodiment in which two dams D1 and D2 are positioned in the peripheral area (LA), and without being limited to the number, two or more dams may be positioned in the peripheral area (LA).

As shown in FIG. 4, the dams D1 and D2 may have a ring shape surrounding the opening area (DTA) in a plan view. This is, however, merely an example, and the first dam D1 and the second dam D2 may have different shapes from the opening area (DTA). For example, the first dam D1 and the second dam D2 may have a closed line shape including a polygon, an oval, or at least a partial curved line, or may be provided in a shape including a plurality of patterns that are partly disconnected, and it is not limited to one embodiment.

An intermediate layer (EL) and a second electrode (E2) may be positioned on the dams D1 and D2. The intermediate layer (EL) and the second electrode (E2) may extend to part of the peripheral area (LA) from the display area (DA). That is, the intermediate layer (EL) and the second electrode (E2) positioned in the display area (DA) may extend to the dams D1 and D2.

The intermediate layer (EL) and the second electrode (E2) positioned on the dams D1 and D2 do not extend onto the inorganic pattern portion (IOP). The intermediate layer (EL) positioned on the dams D1 and D2 and the intermediate layer (EL) positioned on the inorganic pattern portion (IOP) are not connected to each other but are separated from each other. The second electrode (E2) may be positioned on the dams D1 and D2, and not on the inorganic pattern portion (IOP). Therefore, when foreign particles are input through the opening area (DTA), they are prevented from permeating into the display area (DA) through the intermediate layer (EL) or the second electrode (E2), so reliability of the display device may be improved.

A first encapsulation inorganic layer EIL1 extending from the display area (DA) may be positioned in the peripheral area (LA). The first encapsulation inorganic layer EIL1 may be positioned on the second electrode (E2). The first encapsulation inorganic layer EIL1 overlapping the dams D1 and D2 may contact the second electrode (E2). The first encapsulation inorganic layer EIL1 may be positioned on the inorganic pattern portion (IOP). The intermediate layer (EL) is positioned on the inorganic pattern portion (IOP), and the second electrode (E2) is not positioned thereon. Therefore, the first encapsulation inorganic layer EIL1 overlapping the inorganic pattern portion (IOP) may contact the intermediate layer (EL).

The encapsulation organic layer (EOL) positioned on the display area (DA) may extend to part of the peripheral area (LA). An end of the encapsulation organic layer (EOL) may reach the first dam D1. The encapsulation organic layer (EOL) may partially overlap the first dam D1. The first dam D1 may control spreading of a material in the process for forming the encapsulation organic layer (EOL). The encapsulation organic layer (EOL) may have a shape for filling a pace between the end of the display area (DA) and the first dam D1.

A second encapsulation inorganic layer EIL2 overlapping a front surface of the substrate (SUB) may be positioned on the encapsulation organic layer (EOL). That is, the second encapsulation inorganic layer EIL2 may extend to the peripheral area (LA) from the display area (DA). The second encapsulation inorganic layer EIL2 may contact the encapsulation organic layer (EOL) in a region, and it may contact the first encapsulation inorganic layer EIL1 in another region. The second encapsulation inorganic layer EIL2 overlapping the dams D1 and D2 and the inorganic pattern portion (IOP) may contact the first encapsulation inorganic layer EIL1.

The above-noted first electronic module EM1 may be inserted in the region overlapping the opening area (DTA). An inside of the opening area (DTA) may be defined by ends of the substrate (SUB), the buffer layer (BF), the first encapsulation inorganic layer EIL1, and the second encapsulation inorganic layer EIL2. Lateral surfaces of the ends of the substrate (SUB), the buffer layer (BF), the first encapsulation inorganic layer EIL1, and the second encapsulation inorganic layer EIL2 are arranged with respect to each other to configure the opening area (DTA). They are not limited thereto, and it is obvious that some of the constituent elements may be omitted or added to form a boundary of the opening area (DTA).

A method for manufacturing a display device according to an embodiment will now be described with reference to FIG. 7 to FIG. 12.

FIG. 7 to FIG. 12 show processing cross-sectional views of a process for manufacturing a display device according to an embodiment. Descriptions of the above-described constituent elements will be omitted.

Figure 7:
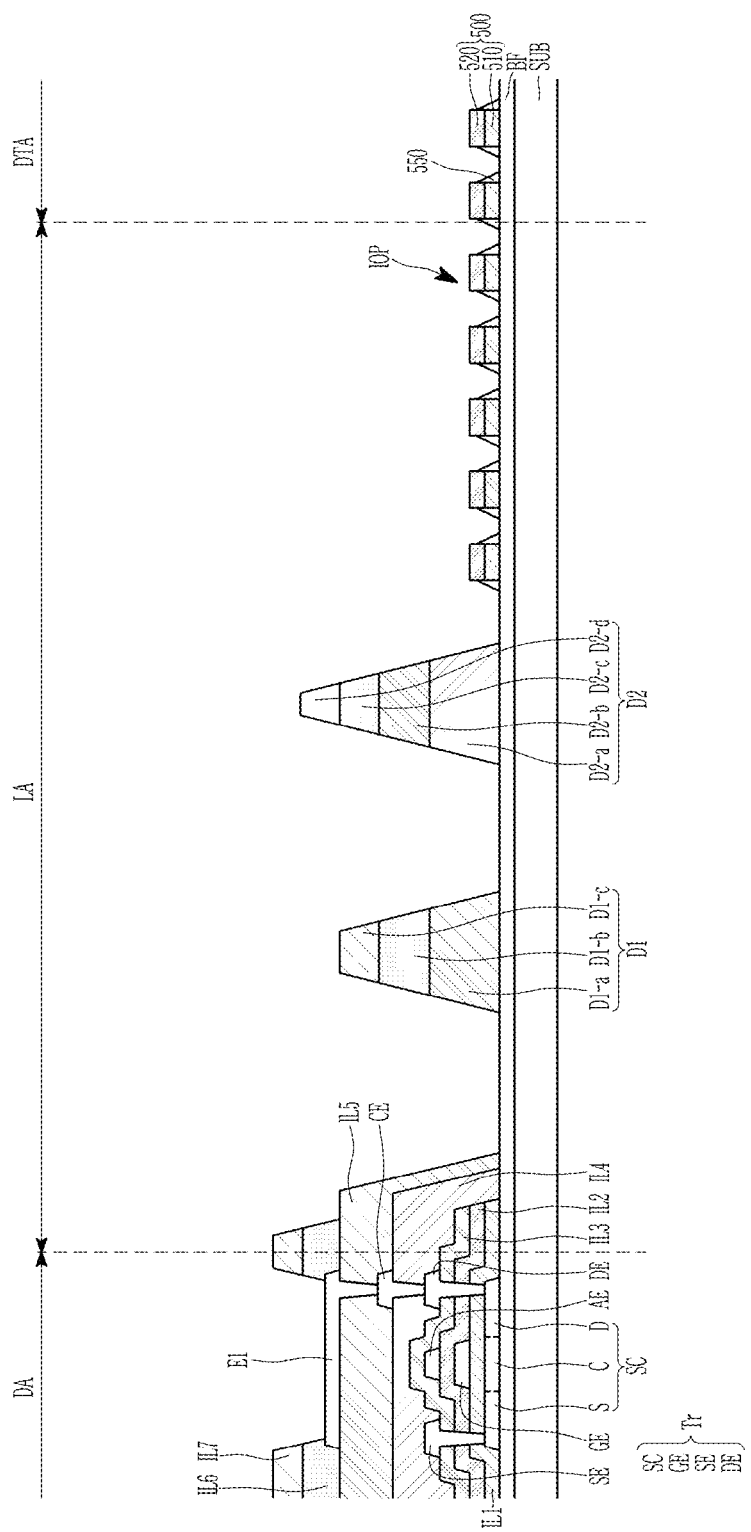
FIGS. 7, 8, 9, 10, 11, and 12 illustrate processing cross-sectional views of a process for manufacturing a display device according to an embodiment.

As shown in FIG. 7, a transistor (Tr) overlapping the display area (DA) and positioned on the substrate (SUB) and a first electrode (E1) connected to the transistor (Tr) are formed. An insulating layer is formed among respective layers configuring the transistor (Tr) and between the transistor (Tr) and the first electrode (E1). The insulating layer may include a first inorganic insulating layer ILL a second inorganic insulating layer IL2, a third inorganic insulating layer IL3, a first organic insulating layer IL4, and a second organic insulating layer IL5.

While the first inorganic insulating layer IL1 and the second inorganic insulating layer IL2 are formed, an inorganic pattern portion (IOP) may be formed in the peripheral area (LA) of the substrate (SUB) and the opening area (DTA). The inorganic pattern portion (IOP) positioned in the opening area (DTA) may be removed together with the substrate (SUB), which will be described in a later portion of the present specification. Therefore, the inorganic pattern portion (IOP) may be formed in the peripheral area (LA) and not in the opening area (DTA). However, when considering errors of a laser beam irradiated position and an opening area (DTA) formed position, as shown in FIG. 7, an inorganic pattern portion (IOP) may be formed in the opening area (DTA). As described above, the inorganic pattern portion (IOP) may include a plurality of inorganic patterns 500, and each inorganic pattern 500 may include a first inorganic pattern layer 510 and a second inorganic pattern layer 520. The first inorganic pattern layer 510 may be formed when the first inorganic insulating layer IL1 is formed, and the second inorganic pattern layer 520 may be formed when the second inorganic insulating layer IL2 is formed.

The respective layers configuring the transistor (Tr) and the first electrode (E1) may be formed by depositing a conductive material such as a metal or a metal oxide and patterning the conductive material by a photo and etching process. In the process for depositing and patterning the conductive material, a sacrificial layer 550 may be formed on the substrate (SUB) provided near the lateral surface of the inorganic pattern portion (IOP) and the lateral surface of the inorganic pattern portion (IOP). The inorganic pattern portion (IOP) may have a lateral surface that is substantially perpendicular to the substrate (SUB), and the conductive material contacting the lateral surface of the inorganic pattern portion (IOP) may not be completely removed but remains in the patterning process, and this may become the sacrificial layer 550. Therefore, at least part of the sacrificial layer 550 may be made of the same material as the electrode of the transistor (Tr) or the first electrode (E1). For example, the sacrificial layer 550 may be made of the same material as that of at least one of the gate electrode (GE), the source electrode (SE), the drain electrode (DE), the connecting member (CE), and the first electrode (E1). The sacrificial layer 550 may be made of a plurality of materials. For example, the sacrificial layer 550 may be made of the same material as the gate electrode (GE) and the source electrode (SE).

The sacrificial layer 550 may have a cross-sectional shape having a predetermined taper angle with respect to the substrate (SUB). The sacrificial layer 550 may have a cross-sectional shape of which the width is gradually reduced as it becomes distant from the substrate (SUB). The cross-sectional shape of the sacrificial layer 550 may substantially be triangular, and it may form a right triangle.

A partition wall IL6 and a spacer IL7 may be formed on the first electrode (E1). The partition wall IL6 may include an opening for exposing at least part of the first electrode (E1). A first dam D1 and a second dam D2 may be formed in the peripheral area (LA). The first dam D1 and the second dam D2 may have a multi-layered structure including an organic material.

Figure 8:
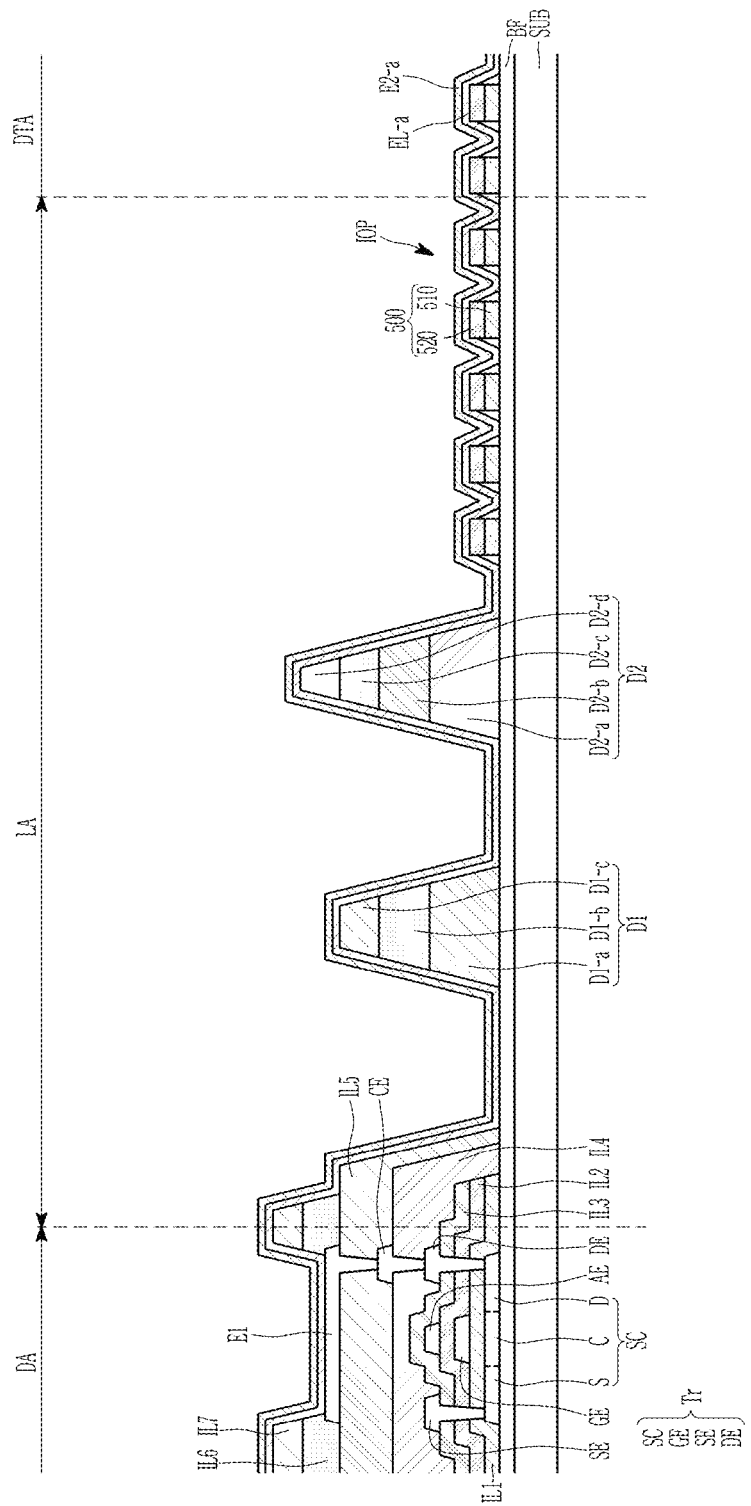

As shown in FIG. 8, the intermediate material layer (EL-a) and the second electrode material layer (E2-a) overlapping the front surface of the substrate (SUB) are formed by using a deposition process. The intermediate material layer (EL-a) and the second electrode material layer (E2-a) may extend to the peripheral area (LA) and may be formed on the front surface of the substrate (SUB).

Figure 9:
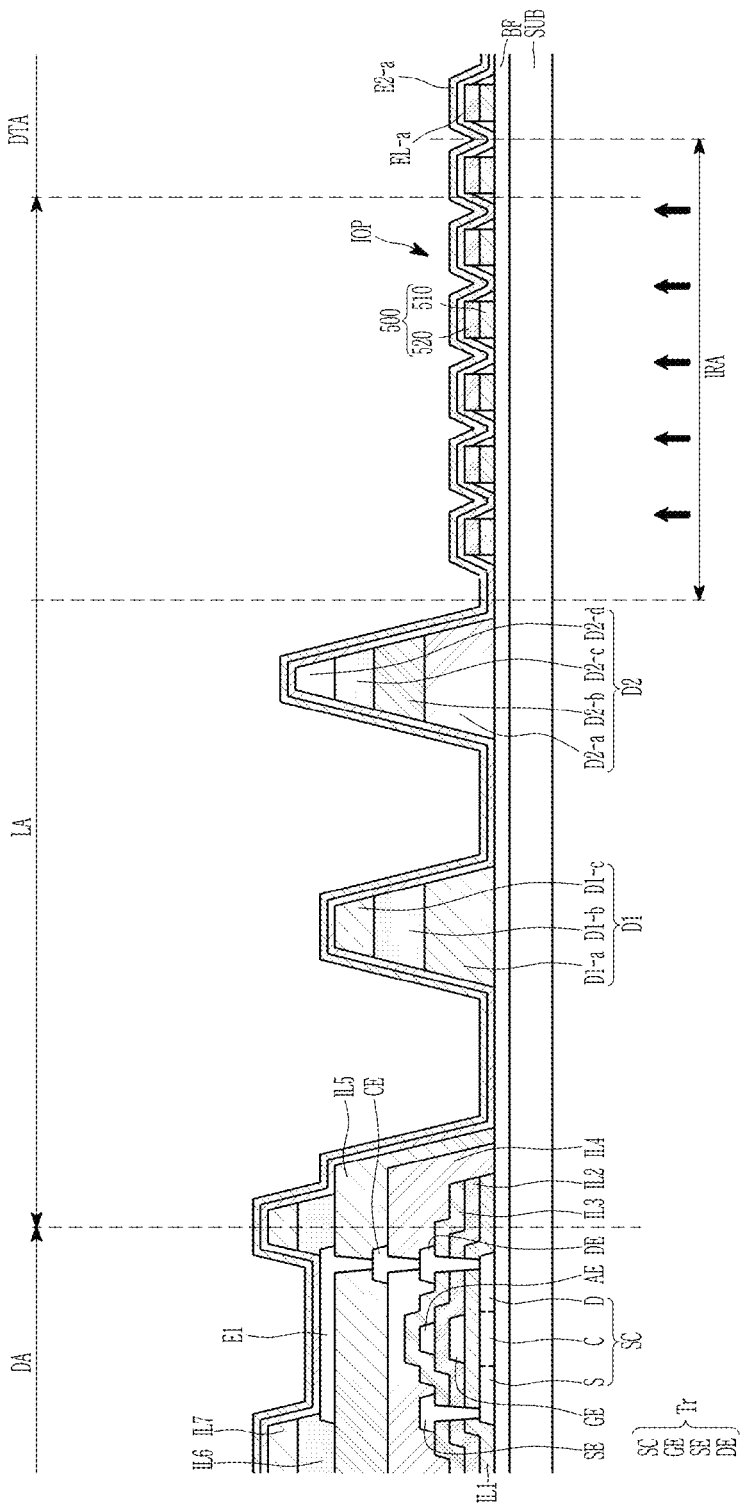

As shown in FIG. 9, laser beams are irradiated to part of the peripheral area (LA). In this instance, the laser beams may be irradiated corresponding to the portion in which the inorganic pattern portion (IOP) is positioned. Laser beams with different energy densities (ED) may be irradiated to a region (IRA) according to an embodiment. For example, laser beams with relatively high energy density may be irradiated to a region in which the sacrificial layer 550 is positioned, and laser beams with relatively low energy density may be irradiated to another region.

Figure 10:
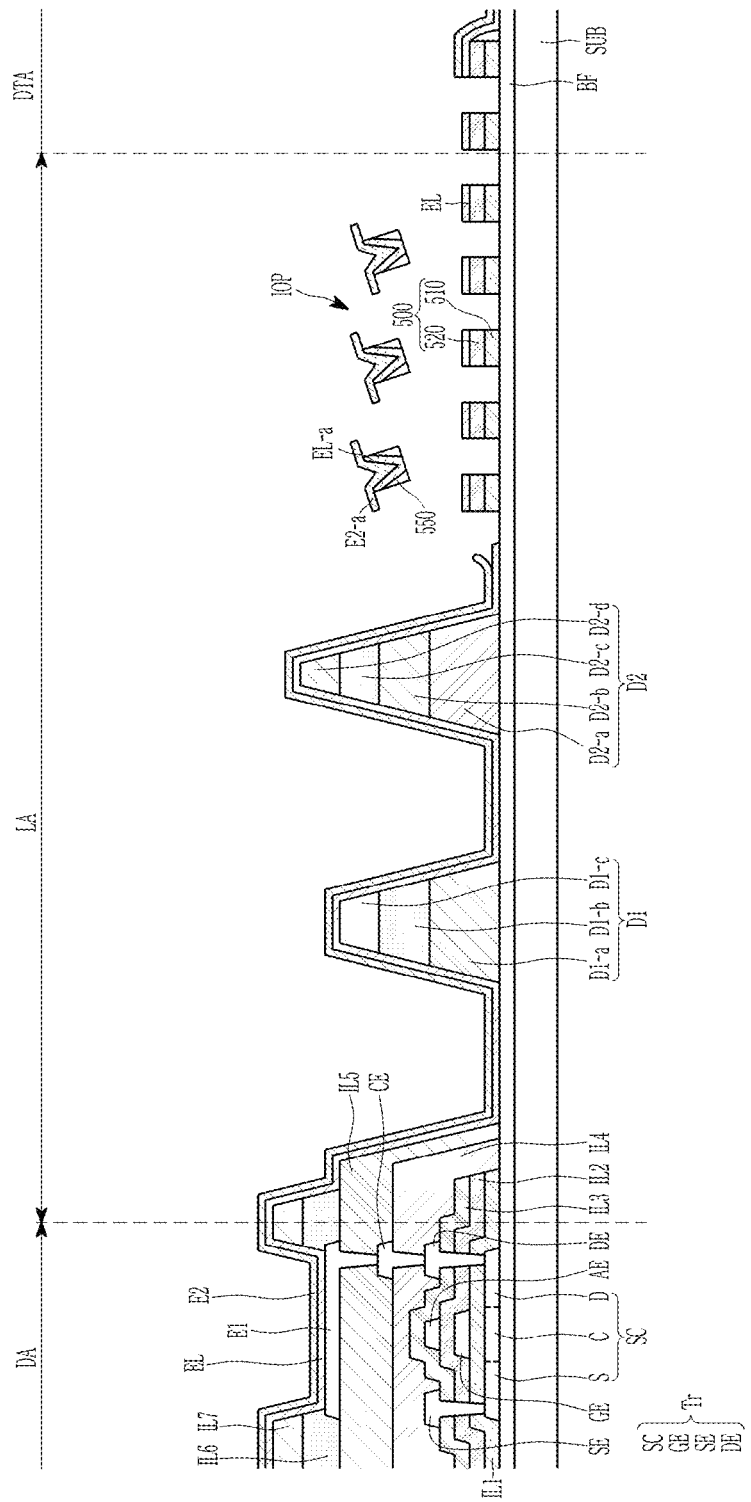

The sacrificial layer 550 is positioned near the lateral surfaces of the respective inorganic patterns 500 on the portion in which the inorganic pattern portion (IOP) is positioned, and the sacrificial layer 550 may be separated from the substrate (SUB) and the buffer layer (BF) by the laser beam irradiating process, as shown in FIG. 10. The sacrificial layer 550 is separated from the substrate (SUB) by laser ablation, and the intermediate material layer (EL-a) and the second electrode material layer (E2-a) positioned on the sacrificial layer 550 may also be separated from the substrate (SUB). Further, the second electrode material layer (E2-a) on which the sacrificial layer 550 is not positioned and which is positioned in the region to which the laser beams are irradiated may also be separated from the substrate (SUB).

The layer made of a metal material may be separated from the substrate (SUB) by irradiation of laser beams. The sacrificial layer 550 includes a metal material, so it may be separated from the substrate (SUB) by irradiation of laser beams. The intermediate material layer (EL-a) includes no metal material, but the intermediate material layer (EL-a) positioned on the sacrificial layer 550 may be separated together when the sacrificial layer 550 is separated from the substrate (SUB). The second electrode material layer (E2-a) includes the metal material, so it may be separated from the substrate (SUB) by irradiation of laser beams.

Figure 11:
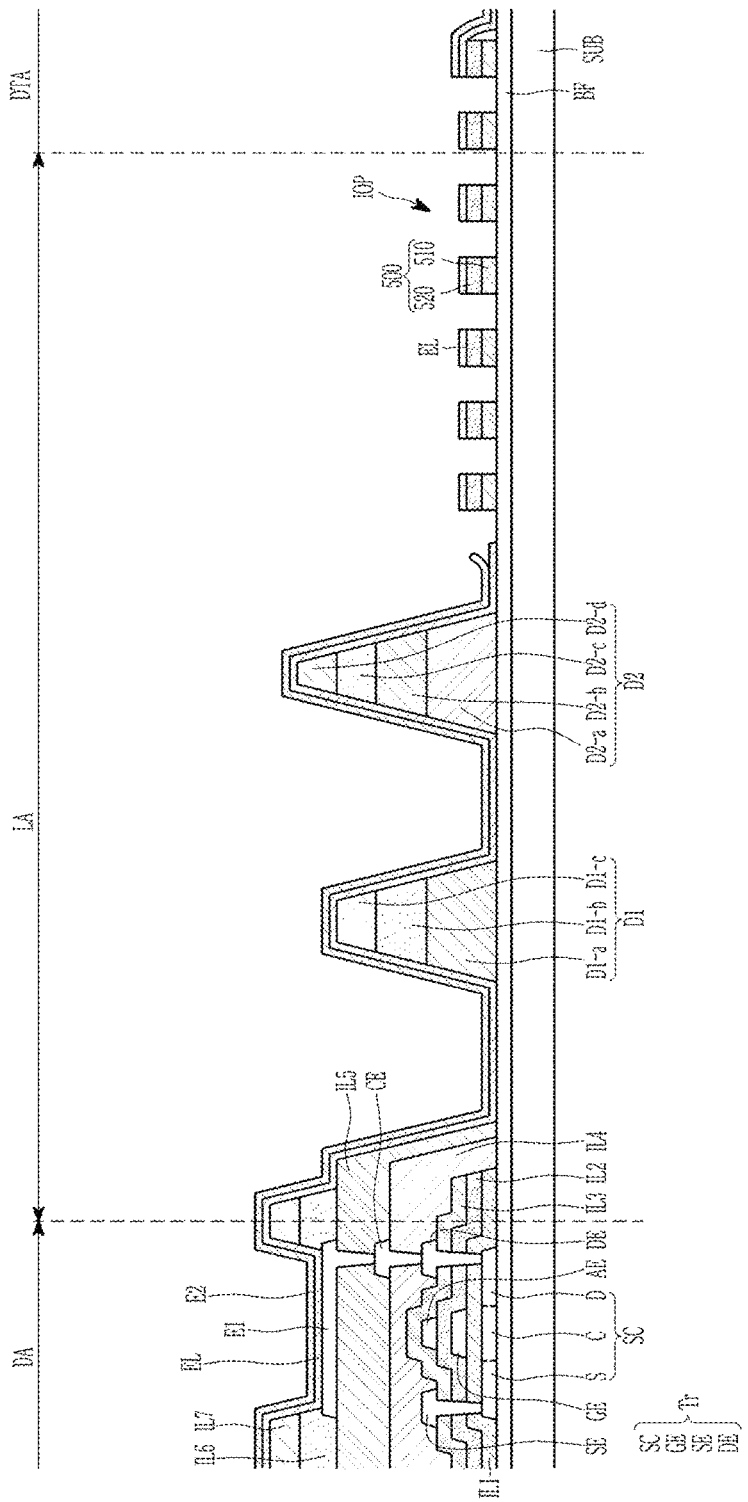

When the sacrificial layer 550 and the intermediate material layer (EL-a) and the second electrode material layer (E2-a) positioned thereon are removed by using the laser beam irradiating process, as shown in FIG. 11, the remaining intermediate material layer (EL-a) becomes the intermediate layer (EL), and the remaining second electrode material layer (E2-a) becomes the second electrode (E2). In the display area (DA), the first electrode (E1), the intermediate layer (EL), and the second electrode (E2) may configure a light-emitting device (LD). The intermediate layer (EL) and the second electrode (E2) may extend to part of the peripheral area (LA), and may be positioned on the first dam D1 and the second dam D2.

The intermediate layer (EL) may be positioned on the upper surface of each inorganic pattern 500 of the inorganic pattern portion (IOP). The intermediate layer (EL) positioned on the inorganic pattern portion (IOP) is not connected to the intermediate layer (EL) positioned in the display area (DA) and is separated therefrom. The intermediate layers (EL) positioned on the respective inorganic patterns 500 are not connected to each other but are separated from each other. The intermediate layer (EL) may not be positioned on the lateral surface of each inorganic pattern 500. The intermediate layer (EL) may not be positioned among the adjacent inorganic patterns 500. Without being limited thereto, as shown in FIG. 6C, the intermediate layer (EL) may remain in a region among the adjacent inorganic patterns 500. In this instance, the intermediate layer (EL) may remain in the region among some of the inorganic patterns 500, and the intermediate layer (EL) may not remain in a region among other inorganic patterns 500. The intermediate layer (EL) positioned on the inorganic pattern 500 is not connected to the intermediate layer (EL) positioned among the inorganic patterns 500 and they are separated from each other.

The second electrode (E2) is not positioned on the inorganic pattern portion (IOP). That is, the second electrode (E2) is not positioned on the intermediate layer (EL) overlapping the inorganic pattern portion (IOP). Therefore, the second electrode (E2) does not overlap the inorganic pattern portion (IOP).

Figure 12:
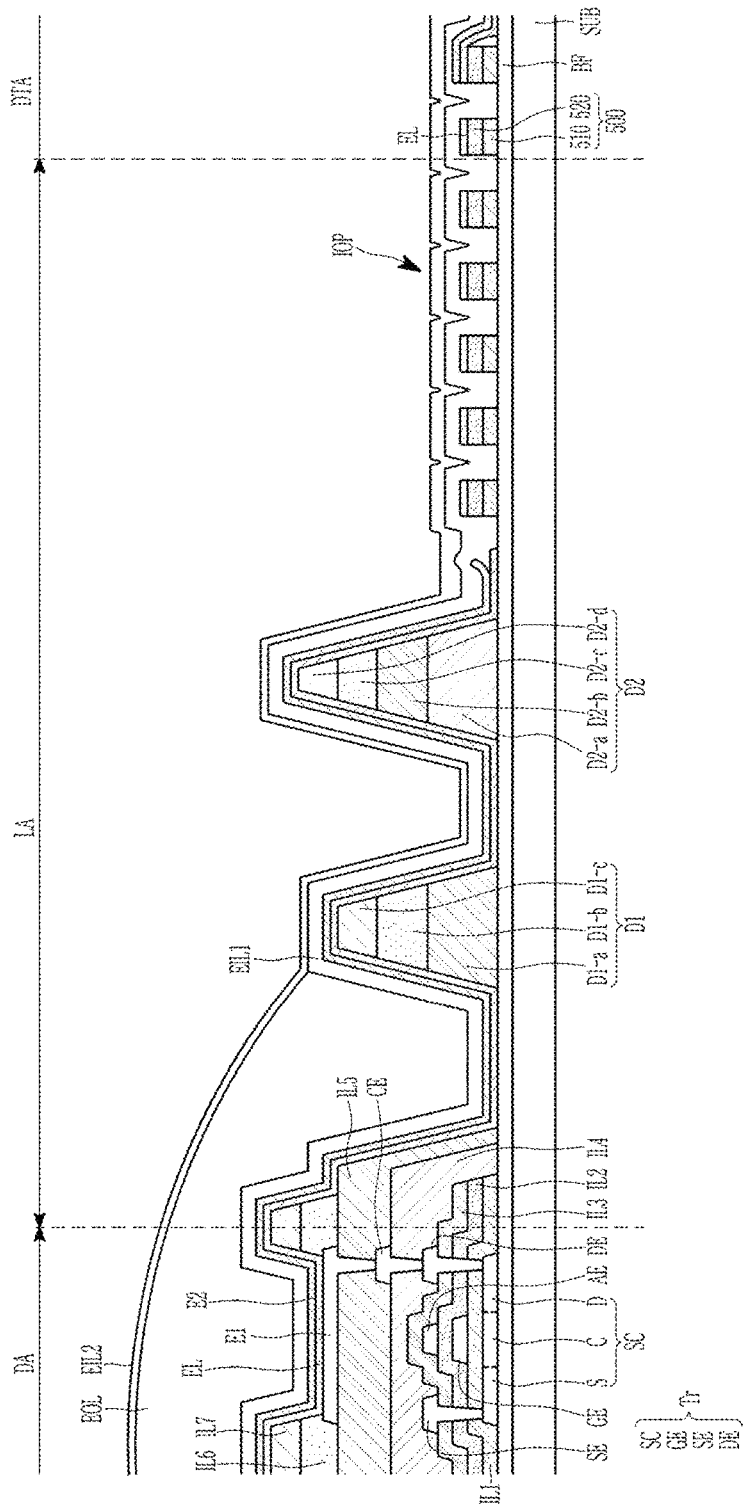

As shown in FIG. 12, a first encapsulation inorganic layer EIL1 may be positioned on the front surface of the substrate (SUB). The encapsulation organic layer (EOL) may be positioned on part of the peripheral area (LA) while overlapping the display area (DA). A liquefied organic material may be prevented from being spread by the dams D1 and D2 in the process for forming an encapsulation organic layer (EOL). The encapsulation organic layer (EOL) may be formed by an inkjet method for coating a liquefied organic material on the first encapsulation inorganic layer EIL1. In this instance, the dams D1 and D2 set a boundary of the region in which the liquefied organic material is coated and prevent the liquefied organic material from overflowing to the outside of the dams D1 and D2. A second encapsulation inorganic layer EIL2 may be positioned on the encapsulation organic layer (EOL) to overlap the front surface of the substrate (SUB). The first encapsulation inorganic layer EIL1 and the second encapsulation inorganic layer EIL2 may contact each other in the peripheral area (LA).

An opening area (DTA) is formed to have a structure shown in FIG. 6A. The opening area (DTA) may be formed by penetrating the display panel. The opening area (DTA) may be formed by a laser or drilling process. The above-described first electronic module may be mounted in the opening area (DTA). The opening area (DTA) may be formed on an inside on which lateral surfaces of the respective ends of the substrate (SUB), the buffer layer (BF), the first encapsulation inorganic layer EIL1, and the second encapsulation inorganic layer EIL2 are arranged.

A realized case of a display device according to an embodiment will now be described with reference to FIG. 13 to FIG. 15.

Figure 13:
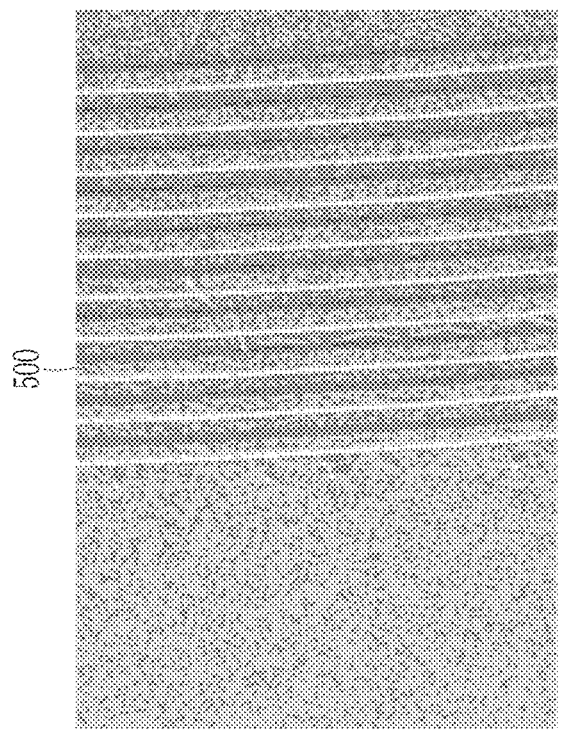
FIG. 13 illustrates a top plan view of an inorganic pattern portion of a display device according to an embodiment.

FIG. 13 shows a top plan view of an inorganic pattern portion of a display device according to an embodiment; FIG. 14 shows a cross-sectional view of an inorganic pattern portion of a display device according to an embodiment; and FIG. 15 shows a cross-sectional view of an enlarged portion of FIG. 14. FIG. 15 shows an enlarged portion (BD) positioned on a boundary between a laser beam irradiated area (IRA) and a laser beam non-irradiated area (NRA) in FIG. 14.

Figure 14:
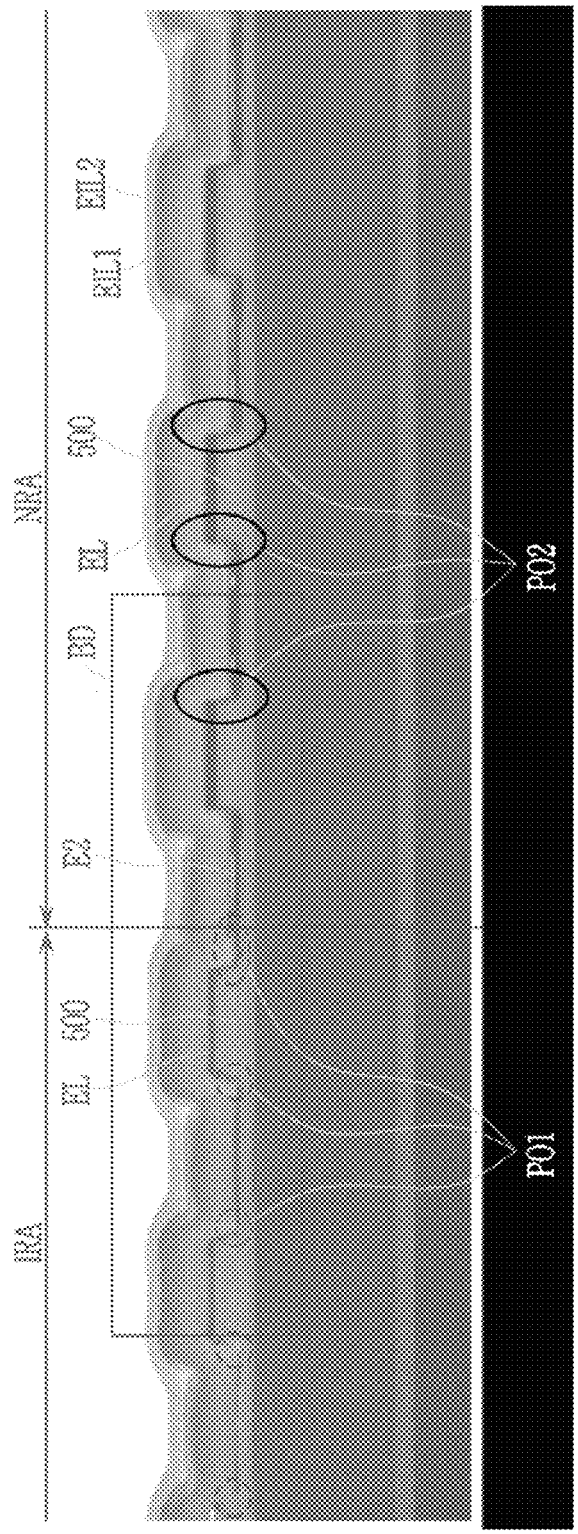
FIG. 14 illustrates a cross-sectional view of an inorganic pattern portion of a display device according to an embodiment.
Figure 15:
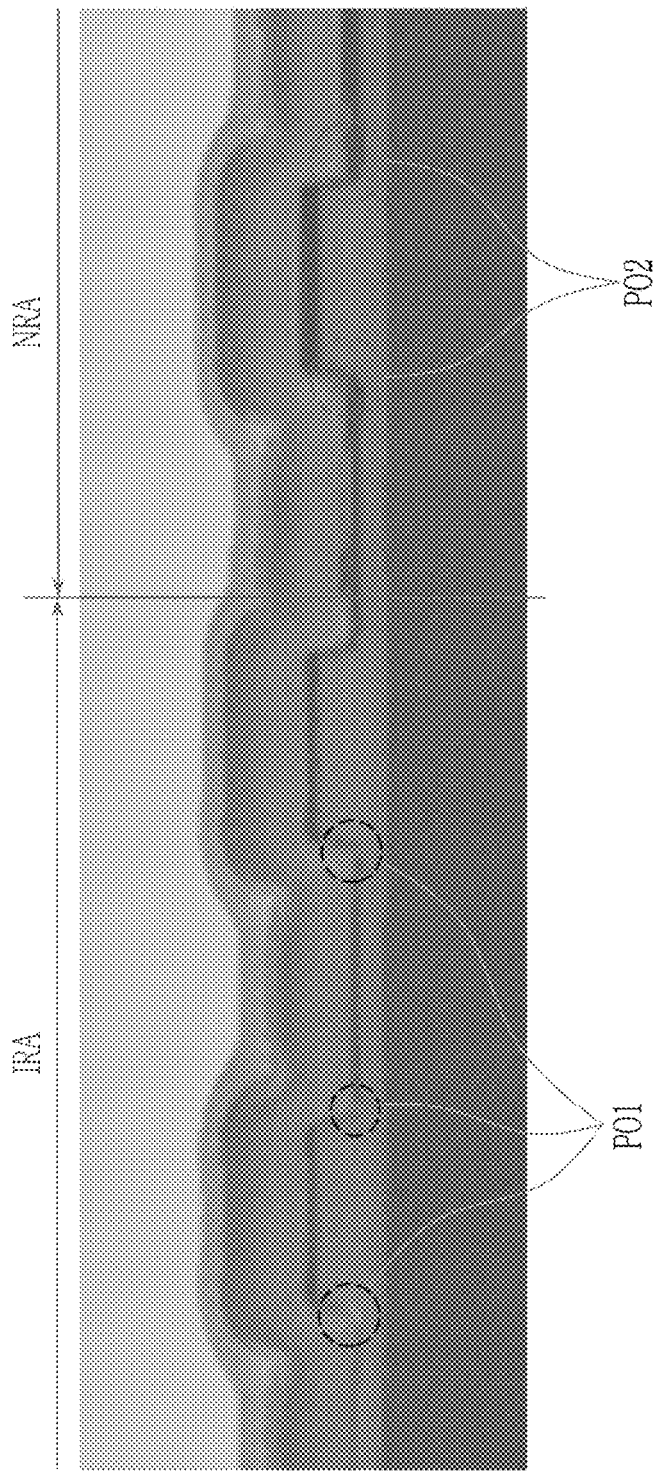
FIG. 15 illustrates a cross-sectional view of an enlarged portion of FIG. 14.

As shown in FIG. 13 to FIG. 15, the inorganic pattern portion may include a plurality of inorganic patterns 500 spaced apart from each other with a predetermined interval. The inorganic pattern portion may be divided into a laser beam irradiated area (IRA) and a laser beam non-irradiated area (NRA) with reference to the irradiation of laser beams. The intermediate layer (EL) and the second electrode may be positioned entirely in the laser beam non-irradiated area (NRA). Referring to a portion P02 shown in FIG. 14 and FIG. 15, it is found that the intermediate layer (EL) positioned on the inorganic pattern 500 and the intermediate layer (EL) positioned among the inorganic patterns 500 are connected to each other in the laser beam non-irradiated area (NRA). The intermediate layer (EL) may be positioned in a predetermined region, and the second electrode (E2) may not be positioned in the laser beam irradiated area (IRA). Referring to a portion P01 shown in FIG. 14 and FIG. 15, it is found that the intermediate layer (EL) positioned on the inorganic pattern 500 and the intermediate layer (EL) positioned among the inorganic patterns 500 are separated from each other in the laser beam irradiated area (IRA)

That is, as the intermediate layer (EL) positioned on a lower portion of the lateral surface of the inorganic pattern 500 is removed by irradiation of laser beams, the connection between the intermediate layer (EL) positioned on the inorganic pattern 500 and the intermediate layer (EL) positioned among the inorganic patterns 500 is no longer maintained. The intermediate layer (EL) positioned among the inorganic patterns 500 is shown to mostly remain, and without being limited thereto, the intermediate layer (EL) positioned among the inorganic patterns 500 may be removed altogether. For example, in the case in which the gap among the inorganic patterns 500 is relatively narrow, the intermediate layer (EL) positioned among the inorganic patterns 500 may be removed when the gap is about 2 μm. For example, in the case in which the gap among the inorganic patterns 500 is relatively wide, the intermediate layer (EL) positioned among the inorganic patterns 500 may remain when the gap is about 10 μm.

A display device according to an embodiment will now be described with reference to FIG. 16 and FIG. 17.

Figure 16:
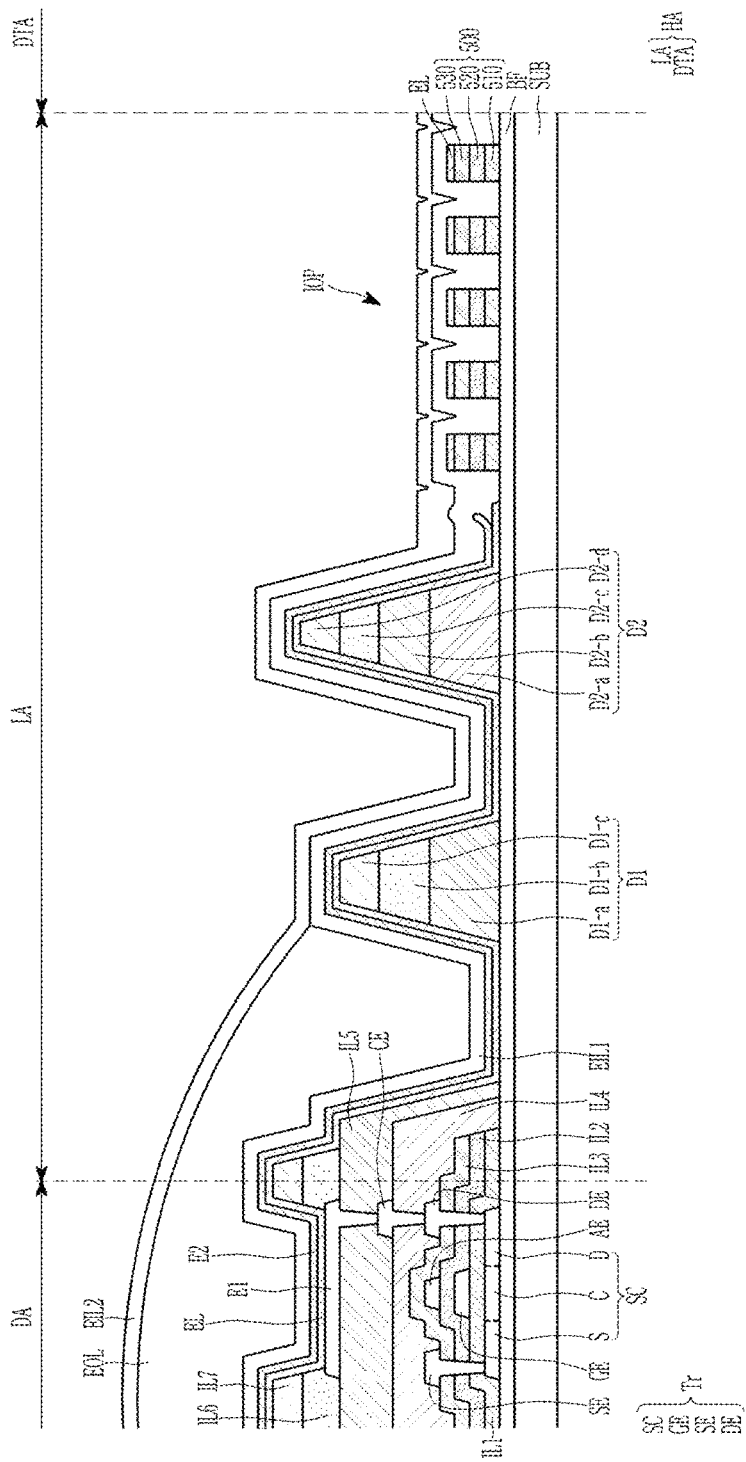
FIG. 16 illustrates a cross-sectional view of a display device according to an embodiment.
Figure 17:
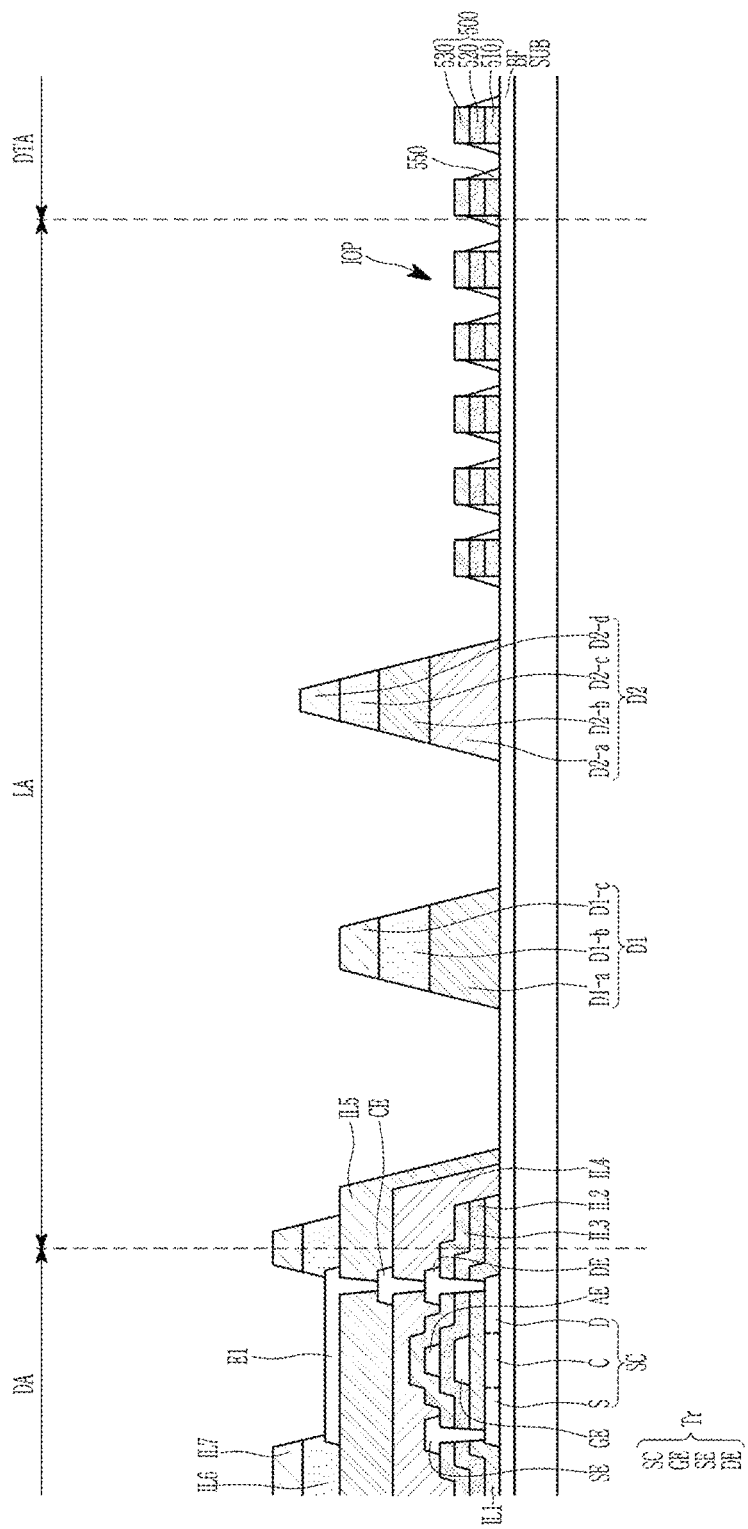
FIG. 17 illustrates a cross-sectional view of some stages in a process for manufacturing a display device according to an embodiment.

The display device according to an embodiment shown in FIG. 16 and FIG. 17 mostly corresponds to the display device according to an embodiment shown in FIG. 1 to FIG. 6, so descriptions of the same portions will be not be repeated. The inorganic pattern portion is configured with triple layers according to the present embodiment, which is different from the previous embodiment and which will now be further described.

FIG. 16 shows a cross-sectional view of a display device according to an embodiment, and FIG. 17 shows a cross-sectional view of some stages in a process for manufacturing a display device according to an embodiment.

As shown in FIG. 16, the display device according to an embodiment includes a substrate (SUB), a transistor (Tr)

positioned in the display area (DA) of the substrate (SUB), a first electrode (E1) connected to the transistor (Tr), a second electrode (E2) positioned on the first electrode (E1), and an intermediate layer (EL) positioned between the first electrode (E1) and the second electrode (E2).

The display device further includes an inorganic pattern portion (IOP) positioned in the peripheral area (LA), and the inorganic pattern portion (IOP) includes a plurality of inorganic patterns 500. The intermediate layer (EL) may also be positioned on the inorganic pattern portion (IOP). The intermediate layer (EL) may be positioned on the upper surface of each inorganic pattern 500, and not on the lateral surface of the inorganic pattern 500. Therefore, the intermediate layers (EL) positioned on the respective inorganic patterns 500 are separated from each other. Further, the intermediate layer (EL) may not be positioned among the inorganic patterns 500. The second electrode (E2) is not positioned on the inorganic pattern portion (IOP).

Each inorganic pattern 500 may be configured to be double layers in the previous embodiment, and each inorganic pattern 500 may be configured to be triple layers in the present embodiment. The inorganic pattern 500 may include a first inorganic pattern layer 510, a second inorganic pattern layer 520, and a third inorganic pattern layer 530. The second inorganic pattern layer 520 may be positioned on the first inorganic pattern layer 510, and the third inorganic pattern layer 530 may be positioned on the second inorganic pattern layer 520.

The first inorganic pattern layer 510 may be made of the same material as the first inorganic insulating layer IL1. The first inorganic pattern layer 510 may be simultaneously formed in the same process as that of the first inorganic insulating layer IL1. The first inorganic pattern layer 510 is not connected to the first inorganic insulating layer IL1. The second inorganic pattern layer 520 may be made of the same material as the second inorganic insulating layer IL2. The second inorganic pattern layer 520 may be simultaneously formed in the same process as that of the second inorganic insulating layer IL2. The second inorganic pattern layer 520 is not connected to the second inorganic insulating layer IL2 and is separated therefrom. The third inorganic pattern layer 530 may be made of the same material as the third inorganic insulating layer IL3. The third inorganic pattern layer 530 may be simultaneously formed in the same process as that of the third inorganic insulating layer IL3. The third inorganic pattern layer 530 is not connected to the third inorganic insulating layer IL3 and is separated therefrom. The materials of the first inorganic pattern layer 510, the second inorganic pattern layer 520, and the third inorganic pattern layer 530 are not limited thereto, and may be changed in many ways.

Regarding the process for manufacturing a display device according to an embodiment, the first inorganic pattern layer 510 may be formed when the first inorganic insulating layer IL1 is formed, as shown in FIG. 17. The second inorganic pattern layer 520 may be formed when the second inorganic insulating layer IL2 is formed, and the third inorganic pattern layer 530 may be formed when the third inorganic insulating layer IL3 is formed.

Also, a sacrificial layer 550 may be formed on the substrate (SUB) provided near the lateral surface of the inorganic pattern portion (IOP) and the lateral surface of the inorganic pattern portion (IOP) when a conductive material is patterned so as to form the respective layers configuring the transistor (Tr) and the first electrode (E1). The sacrificial layer 550 may at least partly include the same material as the gate electrode of the transistor (Tr) and the source/drain electrode or the first electrode (E1). The sacrificial layer 550 may have a cross-sectional shape having a predetermined taper angle with respect to the substrate (SUB).

An intermediate material layer and a second electrode material layer are formed entirely on the substrate (SUB), and the sacrificial layer 550 may be separated from the substrate (SUB) by irradiating laser beams to the portion on which the inorganic pattern portion (IOP) is positioned. Accordingly, the intermediate material layer positioned on the sacrificial layer 550 may be removed. The intermediate layer (EL) remains on the upper surface of each inorganic pattern 500 of the inorganic pattern portion (IOP). The second electrode material layer positioned on the portion to which the laser beams are irradiated may be removed.

Regarding the display device according to an embodiment, the intermediate layer (EL) positioned in the display area and the intermediate layer (EL) positioned on the inorganic pattern portion (IOP) are not connected to each other, and they are separated from each other. The second electrode (E2) positioned in the display area is not positioned on the inorganic pattern portion (IOP). Therefore, when foreign particles are input through the opening area (DTA), they are prevented from permeating into the display area (DA) through the intermediate layer (EL) or the second electrode (E2), so reliability of the display device may be improved.

A display device according to an embodiment will now be described with reference to FIG. 18 and FIG. 19.

Figure 18:
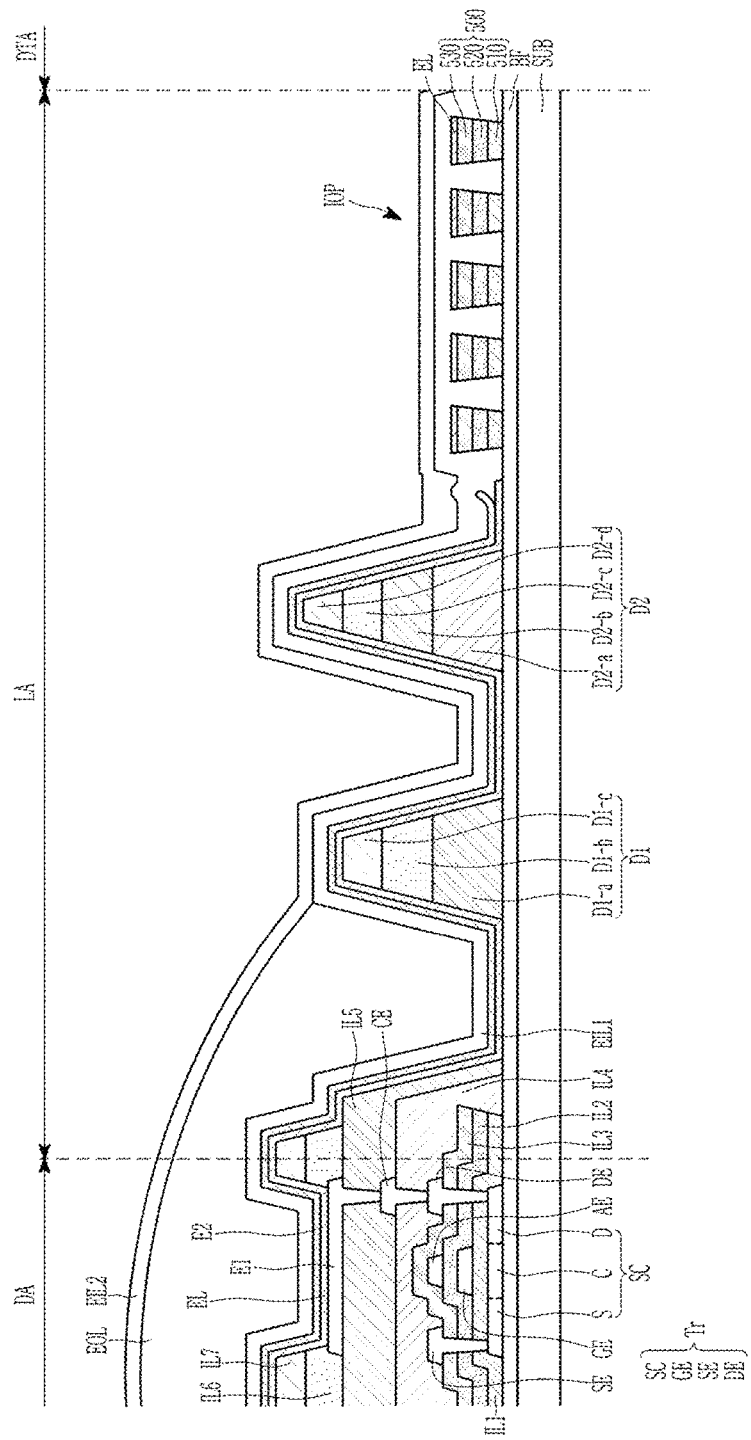
FIG. 18 illustrates a cross-sectional view of a display device according to an embodiment.
Figure 19:
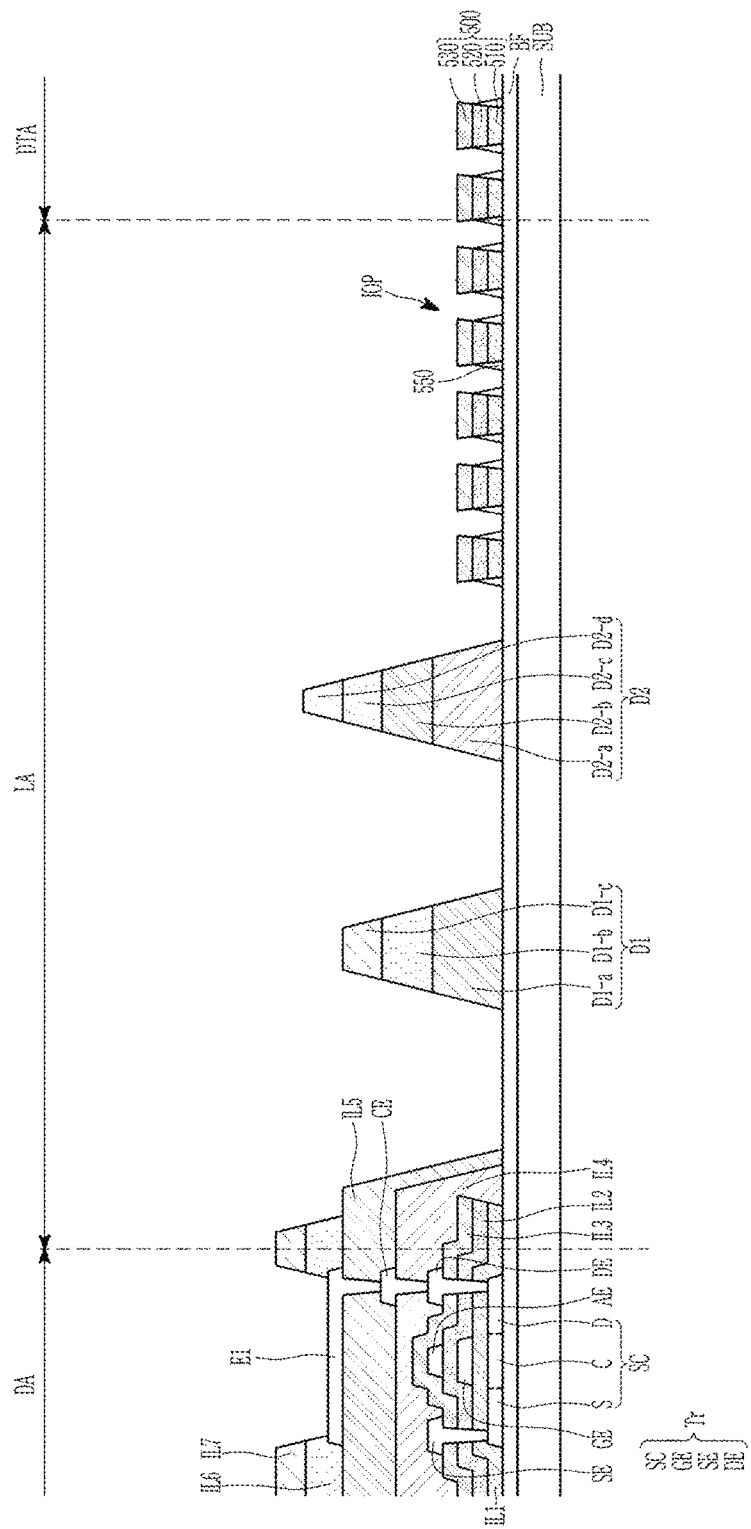
FIG. 19 illustrates a cross-sectional view of some stages in a process for manufacturing a display device according to an embodiment.

The display device according to an embodiment shown in FIG. 18 and FIG. 19 mostly corresponds to the display device according to an embodiment shown in FIG. 16 and FIG. 17, so descriptions of the same portions will not be repeated. The inorganic pattern portion has a reverse taper shape according to the present embodiment, which is different from the previous embodiment, and which will now be described.

FIG. 18 shows a cross-sectional view of a display device according to an embodiment, and FIG. 19 shows a cross-sectional view of some stages in a process for manufacturing a display device according to an embodiment.

As shown in FIG. 18, the display device includes a substrate (SUB), a transistor (Tr) positioned in the display area (DA) of the substrate (SUB), a first electrode (E1) connected to the transistor (Tr), a second electrode (E2) positioned on the first electrode (E1), and an intermediate layer (EL) positioned between the first electrode (E1) and the second electrode (E2).

The display device further includes an inorganic pattern portion (IOP) positioned in the peripheral area (LA), and the inorganic pattern portion (IOP) includes a plurality of inorganic patterns 500. The intermediate layer (EL) may also be positioned on the inorganic pattern portion (IOP). The intermediate layer (EL) may be positioned on the upper surface of each inorganic pattern 500, and not on the lateral surface of the inorganic pattern 500. Therefore, the intermediate layers (EL) positioned on each inorganic pattern 500 are separated from each other. The intermediate layer (EL) may not be positioned among the inorganic patterns 500. The second electrode (E2) is not positioned on the inorganic pattern portion (IOP).

The lateral surface of the inorganic pattern 500 may be formed to be substantially perpendicular to the upper surface of the substrate (SUB) in the previous embodiment, and the lateral surface of the inorganic pattern 500 may have a reverse taper shape in the present embodiment. That is, the width of the inorganic pattern 500 may increase as it becomes distant from the substrate (SUB). The width of the second inorganic pattern layer 520 may be greater than the width of the first inorganic pattern layer 510, and the width of the third inorganic pattern layer 530 may be greater than the width of the second inorganic pattern layer 520. The lateral surfaces of the first inorganic insulating layer ILL the second inorganic insulating layer IL2, and the third inorganic insulating layer IL3 may also have a reverse taper shape.

Regarding the process for manufacturing a display device according to an embodiment, as shown in FIG. 19, the first inorganic pattern layer 510 may be formed when the first inorganic insulating layer IL1 is formed. The second inorganic pattern layer 520 may be formed when the second inorganic insulating layer IL2 is formed, and the third inorganic pattern layer 530 may be formed when the third inorganic insulating layer IL3 is formed. The lateral surfaces of the first inorganic insulating layer ILL the second inorganic insulating layer IL2, and the third inorganic insulating layer IL3 may have a reverse taper shape by using a method for increasing a time for performing an etching process of the first inorganic insulating layer IL1, the second inorganic insulating layer IL2, and the third inorganic insulating layer IL3. Accordingly, the lateral surface of the inorganic pattern 500 may also have a reverse taper shape.

In addition, a sacrificial layer 550 may be formed on the substrate (SUB) provided near the lateral surface of the inorganic pattern portion (IOP) and the lateral surface of the inorganic pattern portion (IOP) in the process for patterning a conductive material so as to form the respective layers of the transistor (Tr) and the first electrode (E1). The sacrificial layer 550 may at least partly include the same material as the gate electrode of the transistor (Tr) and the source/drain electrode or the first electrode (E1). The sacrificial layer 550 may have a cross-sectional shape having a predetermined taper angle with respect to the substrate (SUB). The inorganic pattern 500 has a reverse taper shape, and the sacrificial layer 550 contacts the lateral surface of the inorganic pattern 500, so the inorganic pattern 500 may cover at least part of the sacrificial layer 550.

An intermediate material layer and a second electrode material layer are formed entirely on the substrate (SUB), and the sacrificial layer 550 may be separated from the substrate (SUB) by irradiating laser beams to the portion on which the inorganic pattern portion (IOP) is positioned. Accordingly, the intermediate material layer positioned on the sacrificial layer 550 may be removed. The intermediate layer (EL) remains on the upper surface of each inorganic pattern 500 of the inorganic pattern portion (IOP). The second electrode material layer positioned on the portion to which the laser beams are irradiated may be removed.

Regarding the display device according to an embodiment, the intermediate layer (EL) positioned in the display area and the intermediate layer (EL) positioned on the inorganic pattern portion (IOP) are not connected to each other, and they are separated from each other. The second electrode (E2) positioned in the display area is not positioned on the inorganic pattern portion (IOP). Therefore, when foreign particles are input through the opening area (DTA), they are prevented from permeating into the display area (DA) through the intermediate layer (EL) or the second electrode (E2), so reliability of the display device may be improved.

A display device according to an embodiment will now be described with reference to FIG. 20A, FIG. 20B, and FIG. 21.

Figure 20A:
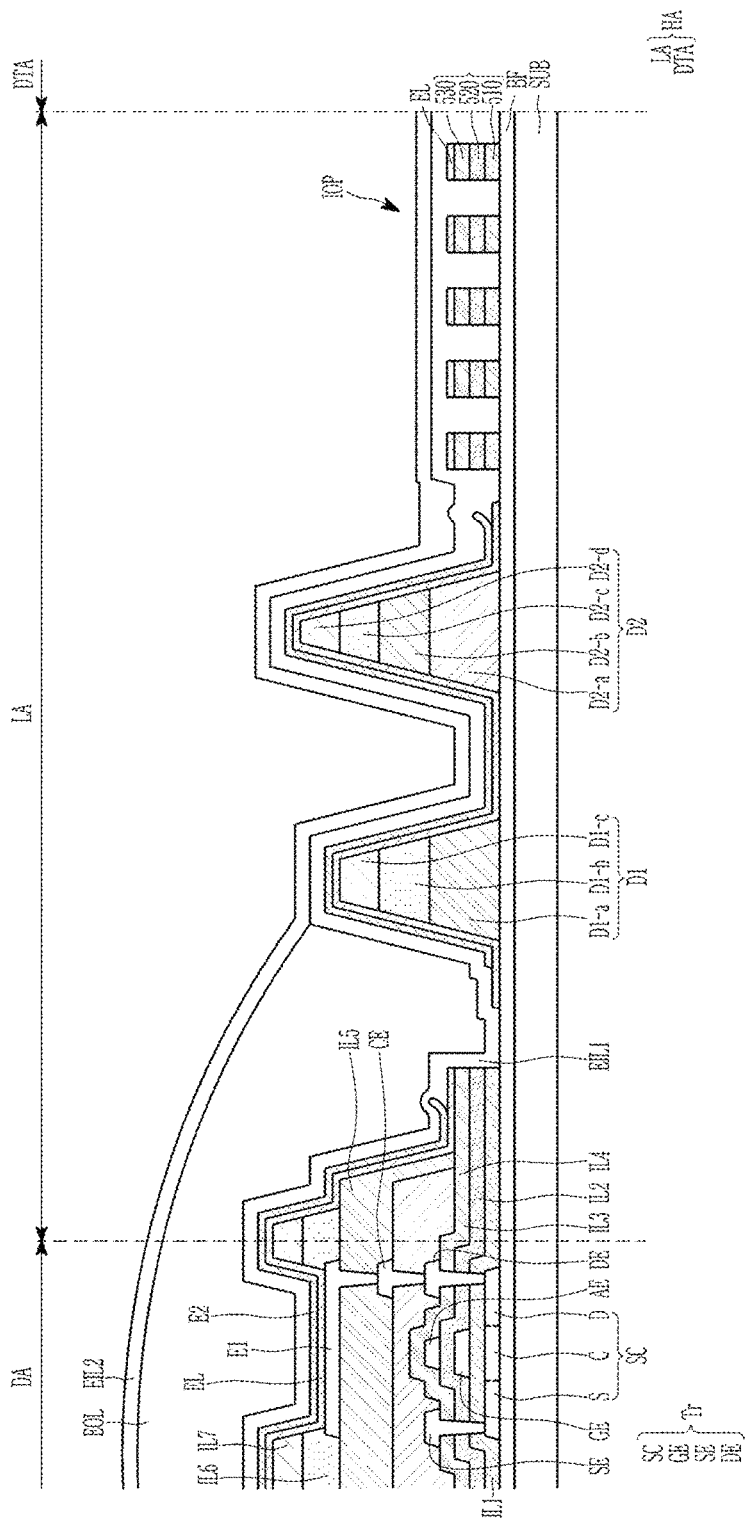
FIG. 20A illustrates a cross-sectional view of a display device according to an embodiment.
Figure 20B:
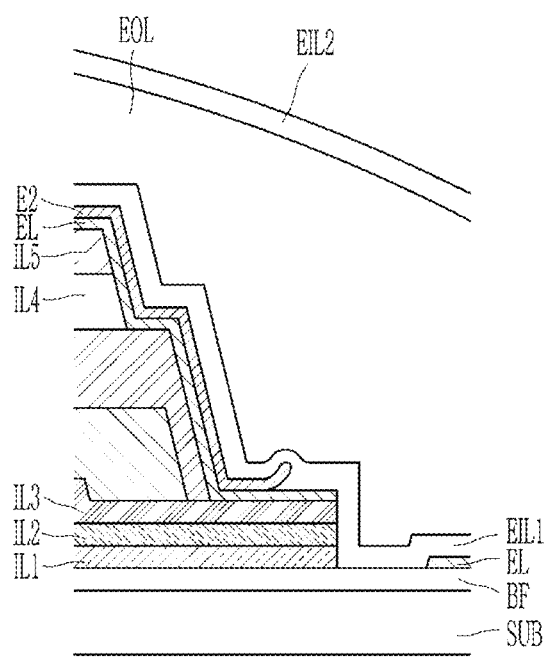
FIG. 20B illustrates a cross-sectional view of an enlarged portion of FIG. 20A.
Figure 21:
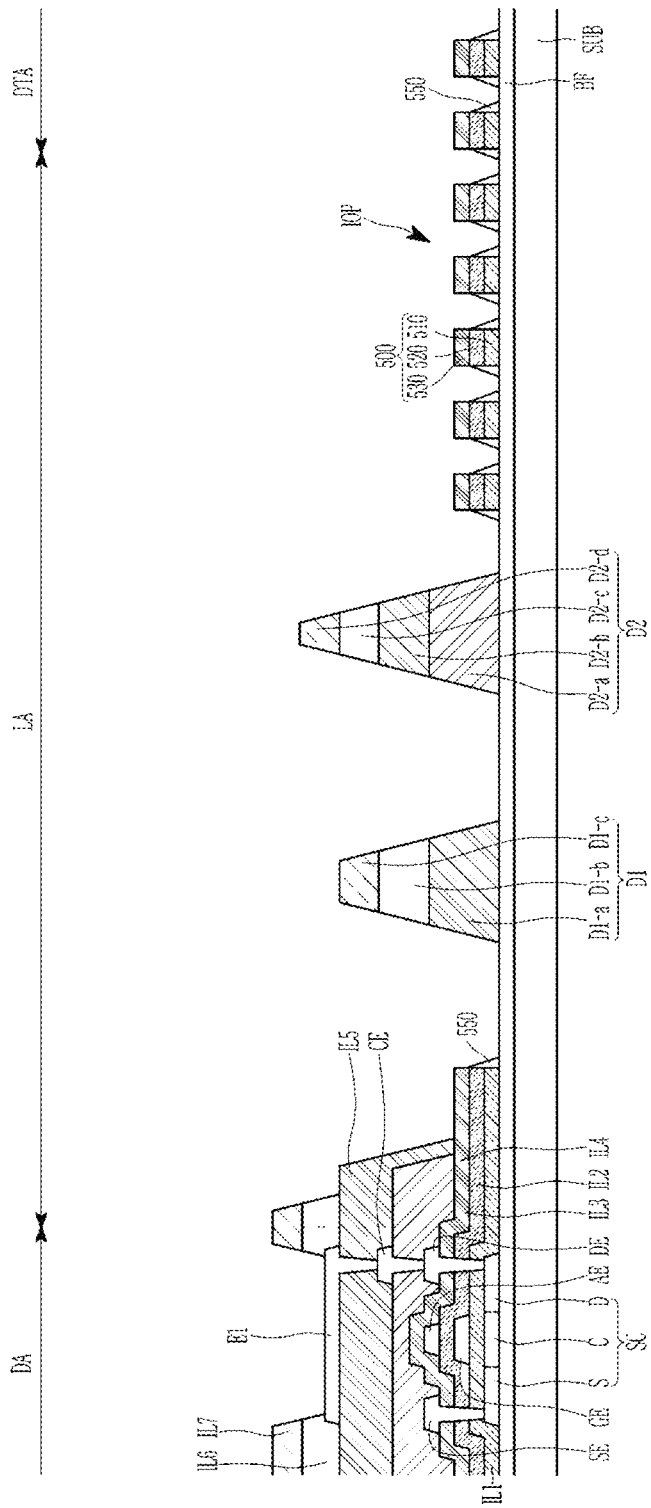
FIG. 21 illustrates a cross-sectional view of some stages in a process for manufacturing a display device according to an embodiment.

The display device according to an embodiment shown in FIG. 20A, FIG. 20B, and FIG. 21 mostly corresponds to the display device according to an embodiment shown in FIG. 16 and FIG. 17, so the same descriptions will not be repeated. The present embodiment is different from the previous embodiment in that the intermediate layer is separated in another region as well as the inorganic pattern portion, which will now be described.

FIG. 20A shows a cross-sectional view of a display device according to an embodiment; FIG. 20B shows a cross-sectional view of an enlarged portion of FIG. 20A; and FIG. 21 shows a cross-sectional view of some stages in a process for manufacturing a display device according to an embodiment.

As shown in FIG. 20A, the display device according to an embodiment includes a substrate (SUB), a transistor (Tr) positioned in the display area (DA) of the substrate (SUB), a first electrode (E1) connected to the transistor (Tr), a second electrode (E2) positioned on the first electrode (E1), and an intermediate layer (EL) positioned between the first electrode (E1) and the second electrode (E2).

Referring to FIG. 20B, the display device further includes an inorganic pattern portion (IOP) positioned in the peripheral area (LA), and the inorganic pattern portion (IOP) includes a plurality of inorganic patterns 500. The intermediate layer (EL) may also be positioned on the inorganic pattern portion (IOP). The intermediate layer (EL) may be positioned on the upper surface of each inorganic pattern 500, and not on the lateral surface of the inorganic pattern 500. Therefore, the intermediate layers (EL) positioned on the respective inorganic patterns 500 are separated from each other. Further, the intermediate layer (EL) may not be positioned among the inorganic patterns 500. The second electrode (E2) is not positioned on the inorganic pattern portion (IOP).

In the previous embodiment, the intermediate layer (EL) is separated on the inorganic pattern portion (IOP), and it may be connected entirely in other regions. In the present embodiment, the intermediate layer (EL) may be separated on the boundary between the display area (DA) and the peripheral area (LA) as well as the inorganic pattern portion (IOP). Ends of the first inorganic insulating layer ILL the second inorganic insulating layer IL2, and the third inorganic insulating layer IL3 are not covered and are exposed by the first organic insulating layer IL4 and the second organic insulating layer IL5. The lateral surfaces of the ends of the first inorganic insulating layer ILL the second inorganic insulating layer IL2, and the third inorganic insulating layer IL3 may be aligned with each other, and may be perpendicular with respect to the upper surface of the substrate (SUB).

An intermediate layer (EL) may be positioned on the upper surfaces of the ends of the first inorganic insulating layer ILL the second inorganic insulating layer IL2, and the third inorganic insulating layer IL3. The intermediate layer (EL) may not be positioned on the lateral surfaces of the ends of the first inorganic insulating layer ILL the second inorganic insulating layer IL2, and the third inorganic insulating layer IL3. The intermediate layer (EL) may not be positioned in the region near the ends of the first inorganic insulating layer ILL the second inorganic insulating layer IL2, and the third inorganic insulating layer IL3. Therefore, the intermediate layer (EL) positioned in the display area (DA) and the intermediate layer (EL) positioned on the dams D1 and D2 may not be connected to each other and may be separated from each other.

In a similar manner, a second electrode (E2) may be positioned on the upper surfaces of the ends of the first inorganic insulating layer ILL the second inorganic insulating layer IL2, and the third inorganic insulating layer IL3. The second electrode (E2) may not be positioned on the lateral surfaces of the ends of the first inorganic insulating layer ILL the second inorganic insulating layer IL2, and the third inorganic insulating layer IL3. The second electrode (E2) may not be positioned in the region positioned near the ends of the first inorganic insulating layer ILL the second inorganic insulating layer IL2, and the third inorganic insulating layer IL3. Hence, the second electrode (E2) positioned on the display area (DA) and the second electrode (E2) positioned on the dams D1 and D2 may not be connected to each other and may be separated from each other.

In this instance, the ends of the intermediate layer (EL) may not correspond to the end of the second electrode (E2). At least part of the end of the intermediate layer (EL) may not be covered by the second electrode (E2).

Regarding the process for manufacturing a display device according to an embodiment, as shown in FIG. 21, the first inorganic pattern layer 510 may be formed when the first inorganic insulating layer IL1 is formed. The second inorganic pattern layer 520 may be formed when the second inorganic insulating layer IL2 is formed, and the third inorganic pattern layer 530 may be formed when the third inorganic insulating layer IL3 is formed.

Also, a sacrificial layer 550 may be formed on the substrate (SUB) provided near the lateral surface of the inorganic pattern portion (IOP) and the lateral surface of the inorganic pattern portion (IOP) when a conductive material is patterned so as to form the respective layers configuring the transistor (Tr) and the first electrode (E1). The sacrificial layer 550 may also be formed on the lateral surfaces of the ends of the first inorganic insulating layer ILL the second inorganic insulating layer IL2, and the third inorganic insulating layer IL3, and the substrate (SUB) provided near them. The sacrificial layer 550 may at least partly include the same material as the gate electrode of the transistor (Tr) and the source/drain electrode or the first electrode (E1).

The first organic insulating layer IL4 and the second organic insulating layer IL5 may be patterned to not cover the ends of the first inorganic insulating layer ILL the second inorganic insulating layer IL2, and the third inorganic insulating layer IL3.

An intermediate material layer and a second electrode material layer are formed entirely on the substrate (SUB). In this instance, the intermediate material layer and the second electrode material layer may be formed to cover the sacrificial layer 550 positioned on the ends of the first inorganic insulating layer ILL the second inorganic insulating layer IL2, and the third inorganic insulating layer IL3. The sacrificial layer 550 may be separated from the substrate (SUB) by irradiating laser beams to the portion in which the inorganic pattern portion (IOP) is positioned and the ends of the first inorganic insulating layer ILL the second inorganic insulating layer IL2, and the third inorganic insulating layer IL3. Accordingly, the intermediate material layer positioned on the sacrificial layer 550 may be removed. The intermediate layer (EL) remains on the upper surface of each inorganic pattern 500 of the inorganic pattern portion (IOP). The second electrode material layer positioned on the portion to which laser beams are irradiated may be removed.

Regarding the display device according to an embodiment, the intermediate layer (EL) positioned in the display area and the intermediate layer (EL) positioned on the dams D1 and D2 are not connected to each other but are separated from each other. The intermediate layer (EL) positioned on the dams D1 and D2 and the intermediate layer (EL) positioned on the inorganic pattern portion (IOP) are not connected to each other but are separated from each other. The second electrode (E2) positioned in the display area is not positioned on the inorganic pattern portion (IOP). The second electrode (E2) positioned in the display area and the second electrode (E2) positioned on the dams D1 and D2 are not connected to each other but are separated from each other.

Therefore, when foreign particles are input through the opening area (DTA), they are prevented from permeating into the display area (DA) through the intermediate layer (EL) or the second electrode (E2), so reliability of the display device may be improved.

According to the inventive concepts, the portion in which no emission layer and no common electrode are positioned is provided in the peripheral area positioned near the opening, thereby preventing the foreign particles from permeating into the display device through the opening and, as a result, improving the reliability of the display device.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate including a display area, an opening area positioned in the display area, and a peripheral area positioned between the opening area and the display area;
    a transistor positioned in the display area of the substrate;
    a first electrode connected to the transistor;
    a second electrode positioned on the first electrode;
    an inorganic pattern portion positioned in the peripheral area of the substrate; and
    an intermediate layer positioned between the first electrode and the second electrode, and including at least one organic layer positioned on the inorganic pattern portion,
    wherein:
    the inorganic pattern portion includes a plurality of inorganic patterns spaced apart from each other; and
    the second electrode does not overlap the inorganic pattern portion.

2. The display device of claim 1, wherein the intermediate layer is positioned on an upper surface of the inorganic pattern portion, and does not extend over a lateral surface of the inorganic pattern portion.

3. The display device of claim 2, wherein the intermediate layer is not positioned among adjacent inorganic patterns.

4. The display device of claim 2, wherein the intermediate layer positioned in the display area is separated from the intermediate layer positioned on the inorganic pattern portion.

5. The display device of claim 1, further comprising an inorganic insulating layer positioned among a plurality of layers configuring the transistor,
    wherein the inorganic pattern portion includes a same material as the inorganic insulating layer.

6. The display device of claim 5, wherein:
    the inorganic insulating layer includes a first inorganic insulating layer and a second inorganic insulating layer; and
    the inorganic pattern includes:
        a first inorganic pattern layer including a same material as the first inorganic insulating layer; and a second inorganic pattern layer including a same material as the second inorganic insulating layer.

7. The display device of claim 5, wherein:
the inorganic insulating layer includes at least three inorganic insulating layers; and
the inorganic pattern includes at least three inorganic pattern layers including the same material as the inorganic insulating layer.

8. The display device of claim 5, wherein:
an end of the inorganic insulating layer is positioned on a boundary portion between the display area and the peripheral area; and
the intermediate layer is separated at the end of the inorganic insulating layer.

9. The display device of claim 8, wherein the intermediate layer is positioned on an upper surface of the end of the inorganic insulating layer, and is not positioned on a lateral surface of the inorganic insulating layer.

10. A display device comprising:
a substrate including a display area, an opening area positioned in the display area, and a peripheral area positioned between the opening area and the display area;
a transistor positioned in the display area of the substrate;
a first electrode connected to the transistor;
a second electrode positioned on the first electrode;
an inorganic pattern portion positioned in the peripheral area of the substrate; and
an intermediate layer positioned between the first electrode and the second electrode, and including at least one organic layer positioned on the inorganic pattern portion,
wherein:
the inorganic pattern portion includes a plurality of inorganic patterns spaced apart from each other; and
an angle between a lateral surface of the inorganic pattern and an upper surface of the substrate is equal to or greater than 75 degrees and equal to or less than 120 degrees.

11. The display device of claim 10, wherein the lateral surface of the inorganic pattern is perpendicular to the upper surface of the substrate.

12. The display device of claim 1, wherein the inorganic pattern has a reverse taper shape.

13. The display device of claim 1, wherein the opening area overlaps an electronic module.

14. The display device of claim 1, wherein:
the intermediate layer includes an organic function layer; and
the organic function layer includes at least one of a hole injection layer, a hole transporting layer, an electron transporting layer, and an electron injection layer.

* * * * *